(12) United States Patent
Guo et al.

(10) Patent No.: US 8,853,788 B2
(45) Date of Patent: Oct. 7, 2014

(54) REPLACEMENT GATE ELECTRODE WITH PLANAR WORK FUNCTION MATERIAL LAYERS

(71) Applicant: International Business Machines Corporation, Armonk, NY (US)

(72) Inventors: Dechao Guo, Fishkill, NY (US); Shu-Jen Han, Cortlandt Manor, NY (US); Keith Kwong Hon Wong, Wappingers Falls, NY (US); Jun Yuan, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/058,774

(22) Filed: Oct. 21, 2013

(65) Prior Publication Data

US 2014/0042561 A1 Feb. 13, 2014

Related U.S. Application Data

(62) Division of application No. 13/186,597, filed on Jul. 20, 2011, now Pat. No. 8,569,135.

(51) Int. Cl.
| | |
|---|---|
| *H01L 21/70* | (2006.01) |
| *H01L 29/66* | (2006.01) |
| *H01L 29/78* | (2006.01) |
| *H01L 29/49* | (2006.01) |
| *H01L 29/423* | (2006.01) |
| *H01L 21/8238* | (2006.01) |
| *H01L 29/165* | (2006.01) |
| *H01L 29/417* | (2006.01) |
| *H01L 29/51* | (2006.01) |

(52) U.S. Cl.
CPC ......... *H01L 29/42364* (2013.01); *H01L 29/517* (2013.01); *H01L 29/513* (2013.01); *H01L 29/6659* (2013.01); *H01L 29/7848* (2013.01); *H01L 29/4966* (2013.01); *H01L 29/7843* (2013.01); *H01L 29/665* (2013.01); *H01L 29/66636* (2013.01); *H01L 21/823807* (2013.01); *H01L 29/165* (2013.01); *H01L 21/823842* (2013.01); *H01L 29/41775* (2013.01); *H01L 29/4958* (2013.01); *H01L 29/66545* (2013.01); *H01L 29/7833* (2013.01); *H01L 21/823814* (2013.01)
USPC ............ 257/369; 257/407; 257/412; 438/275

(58) Field of Classification Search
None
See application file for complete search history.

(56) References Cited

U.S. PATENT DOCUMENTS

| | | |
|---|---|---|
| 6,159,782 A | 12/2000 | Xiang et al. |
| 6,392,280 B1 | 5/2002 | Besser et al. |
| 6,504,210 B1 | 1/2003 | Divakaruni et al. |

(Continued)

OTHER PUBLICATIONS

International Search Report and Written Opinion dated Jun. 19, 2012 issued in International Application No. PCT/US12/27844.

(Continued)

*Primary Examiner* — Andres Munoz
(74) *Attorney, Agent, or Firm* — Scully, Scott, Murphy & Presser, P.C.; Vazken Alexanian

(57) ABSTRACT

In a replacement gate scheme, a continuous material layer is deposited on a bottom surface and a sidewall surface in a gate cavity. A vertical portion of the continuous material layer is removed to form a gate component of which a vertical portion does not extend to a top of the gate cavity. The gate component can be employed as a gate dielectric or a work function material portion to form a gate structure that enhances performance of a replacement gate field effect transistor.

17 Claims, 15 Drawing Sheets

(56) References Cited

U.S. PATENT DOCUMENTS

| | | |
|---|---|---|
| 6,921,711 B2 | 7/2005 | Cabral, Jr. et al. |
| 7,005,365 B2 | 2/2006 | Chambers |
| 7,078,282 B2 | 7/2006 | Chau et al. |
| 7,126,199 B2 | 10/2006 | Doczy et al. |
| 7,208,361 B2 | 4/2007 | Shah et al. |
| 7,422,936 B2 | 9/2008 | Barns et al. |
| 2003/0003652 A1 | 1/2003 | Gobel et al. |
| 2003/0109140 A1 | 6/2003 | Lee |
| 2007/0111470 A1 | 5/2007 | Smythe et al. |
| 2008/0076216 A1 | 3/2008 | Pae et al. |
| 2009/0057769 A1 | 3/2009 | Wei et al. |
| 2009/0124057 A1 | 5/2009 | Guha et al. |
| 2009/0189201 A1 | 7/2009 | Chang et al. |
| 2009/0212332 A1 | 8/2009 | Wang et al. |
| 2010/0013011 A1 | 1/2010 | Ashrafzadeh |
| 2010/0019215 A1 | 1/2010 | Lung et al. |
| 2010/0052060 A1 | 3/2010 | Lai et al. |
| 2012/0104469 A1 | 5/2012 | Li et al. |

OTHER PUBLICATIONS

Natarajan, S. et al., "A 32nm Logic Technology Featuring 2nd-Generation High-k + Metal-Gate Transistors, Enhanced Channel Strain and 0.17um2 SRAM Cell Size in a 291Mb Array" IEEE International Electron Devices Meeting, IEDM (Dec. 15-17, 2008) pp. 3 pages.

Auth, C.A. et al., "45nm High-k + Metal Gate Strain-Enhanced Transistors" 2008 Symposium on VLSI Technology Digest of Technical Papers (Jun. 17-19, 2008) pp. 128-129.

Ghani, T., "Challenges and Innovations in Nano-CMOS Transistor Scaling" Nikkei Presentation (Oct. 2009) http://download.intel.com/technology/silicon/Neikei_Presentation_2009_Tahir_Ghani.pdf, downloaded Jan. 7, 2010.

Kesapragada, S. et al., "High-k / Metal Gate Stacks in Gate First and replacement Gate Schemes" IEEE/Semi Advanced Semiconductor Manufacturing Conference (ASMC) (Jul. 11-13, 2010) pp. 256-259.

Kim, H., "Atomic Layer Deposition of Metal and Nitride Thin Films: Current Research Efforts and Applications for Semiconductor Device Processing" Journal of Vacuum Science & Technology B (Nov.-Dec. 2003) pp. 2231-2261, vol. 21, No. 6.

REPLACEMENT GATE ELECTRODE WITH PLANAR WORK FUNCTION MATERIAL LAYERS

CROSS REFERENCE TO RELATED APPLICATION

This application is a divisional of U.S. patent application Ser. No. 13/186,597, filed Jul. 20, 2011 the entire content and disclosure of which is incorporated herein by reference.

BACKGROUND

The present disclosure relates to semiconductor structures, and particularly to a metal-oxide-semiconductor field effect transistor (MOSFET) having a high performance replacement gate electrode configured to provide reduced parasitic capacitance and/or low resistance, and methods of manufacturing the same.

A replacement gate metal-oxide-semiconductor field effect transistor (MOSFET) can accommodate a high dielectric constant (high-k) gate dielectric material that is prone to degradation at high temperature due to decomposition or other structural degradation mechanisms. A replacement gate MOSFET is formed by forming activated source and drain regions and optionally metal semiconductor alloys before deposition of a gate dielectric and a gate electrode. A replacement gate MOSFET employs a recessed region, which is typically referred to as a "gate cavity," that is subsequently filled with a gate dielectric and a gate electrode. The recessed region is typically formed by removing a disposable gate structure. Because the gate dielectric and the gate electrode "replaces" the disposable gate structure by filling the gate cavity, the gate dielectric material, which is typically a high-k gate dielectric material, follows the contour of the recessed region.

A challenge in employing the replacement gate scheme to manufacture high performance devices is to fill gate cavities with a conductive material having a high conductivity. The overall conductivity of replacement gate conductor structures is limited due to the relatively high conductivity of materials employed as work function material layers. While the optimal work function material layers can provide appropriate work function levels for p-type field effect transistors and n-type field effect transistors, respectively, such work function material layers do not provide as high conductivity as a conductive fill material that fills the remaining portion of a gate cavity. Further, the presence of the work function material layers on sidewalls of gate cavities reduces the width of the gate cavities so that the volume that the conductive fill material can occupy is reduced. In addition, reduction of width with scaling in conjunction with the presence of work function material layers on sidewalls of gate cavities can cause formation of voids during the filling of the gate cavities with the conductive fill material. The combination of the above factors contributes to a significant increase in the resistivity of gate conductors in replacement gate structures as device scaling continues, and limits performance of advanced replacement gate field effect transistors.

BRIEF SUMMARY

Replacement gate work function material stacks are provided, which provide a work function about the energy level of the conduction band of silicon. After removal of a disposable gate stack, a gate dielectric layer is formed in a gate cavity. A metallic layer including a metal and a non-metal element is deposited directly on the gate dielectric layer. At least one barrier layer and a metal layer are deposited and planarized to fill the gate cavity. The metallic layer includes a material having a work function about 4.0 eV, and specifically, less than 4.4 eV, and can include a material selected from tantalum carbide and a hafnium-silicon alloy. Thus, the metallic layer can provide a work function that enhances the performance of an n-type field effect transistor employing a silicon channel.

According to an aspect of the present disclosure, a method of forming a semiconductor structure is provided. The method includes: forming a gate cavity laterally surrounded by a planarization dielectric layer on a semiconductor substrate, wherein a top surface of the semiconductor substrate is exposed at a bottom of the gate cavity; forming a gate dielectric layer in the gate cavity; forming at least one planar work function material portion having a topmost surface that is recessed from a topmost surface of the planarization dielectric layer on the gate dielectric layer in the gate cavity; and filling the gate cavity with a metal layer contacting the at least one planar work function material portion.

According to another aspect of the present disclosure, a semiconductor structure is provided, which includes: a planarization dielectric layer having a planar topmost surface and located on a semiconductor substrate; a U-shaped gate dielectric located on the semiconductor substrate and embedded in the planarization dielectric layer; at least one planar work function material portion located within the U-shaped gate dielectric and having a topmost surface that is recessed from a topmost surface of the planarization dielectric layer; and a metal portion having a top surface that is coplanar with the top surface of the planarization dielectric layer.

DETAILED DESCRIPTION

Figure 1:
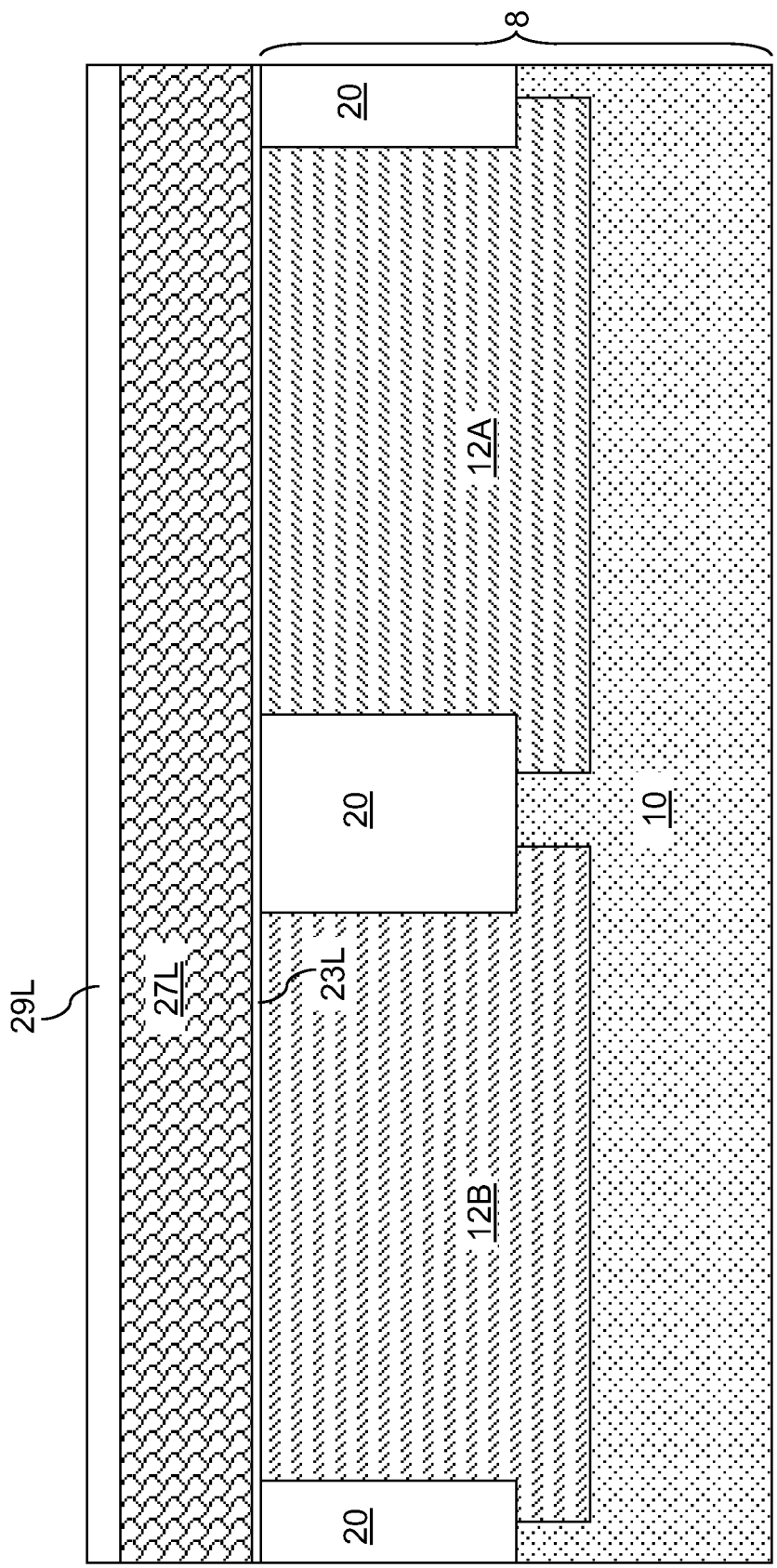
FIG. 1 is vertical cross-sectional view of an exemplary semiconductor structure after formation of disposable gate level layers according to an embodiment of the present disclosure.

As stated above, the present disclosure relates to semiconductor structures having dual work function material gates and a high-k gate dielectric, and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, an exemplary semiconductor structure according to an embodiment of the present disclosure includes a semiconductor substrate 8, on which various components of field effect transistors are subsequently formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of n-type or p-type at different dopant concentration levels. For example, the semiconductor substrate 8 may include an underlying semiconductor layer 10, a second conductivity type well 12A formed in a first device region (the region on the left side in FIG. 1), and a first conductivity type well 12B formed in a second device region (the region on the right side in FIG. 1). The first conductivity type well 12B is doped with dopants of a first conductivity type, which can be n-type or p-type. The second conductivity type well 12A is doped with dopants of a second conductivity type, which is the opposite of the first conductivity type. If the first conductivity type is p-type, the second conductivity type is n-type, and vice versa.

Shallow trench isolation structures 20 are formed to laterally separate each of the first conductivity type well 12B and the second conductivity type well 12A. Typically, each of the first conductivity type well 12B and the second conductivity type well 12A is laterally surrounded by a contiguous portion of the shallow trench isolation structures 20. If the semiconductor substrate 8 is a semiconductor-on-insulator substrate, bottom surfaces of the first conductivity type well 12B and the second conductivity type well 12A may contact a buried insulator layer (not shown), which electrically isolates each of the first conductivity type well 12B and the second conductivity type well 12A from other semiconductor portions of the semiconductor substrate 8 in conjunction with the shallow trench isolation structures 20. In one embodiment, topmost surfaces of the shallow trench isolation structures can be substantially coplanar with topmost surfaces of the first conductivity type well 12B and the second conductivity type well 12A.

Disposable gate level layers are deposited on the semiconductor substrate 8 as blanket layers, i.e., as unpatterned contiguous layers. The disposable gate level layers can include, for example, a vertical stack a disposable gate dielectric layer 23L, a disposable gate material layer 27L, and a disposable gate cap dielectric layer 29L. The disposable gate dielectric layer 23L can be, for example, a layer of silicon oxide, silicon nitride, or silicon oxynitride. The thickness of the disposable gate dielectric layer 23L can be from 1 nm to 10 nm, although lesser and greater thicknesses can also be employed. The disposable gate material layer 27L includes a material that can be subsequently removed selective to the dielectric material of a planarization dielectric layer to be subsequently formed. For example, the disposable gate material layer 27L can include a semiconductor material such as a polycrystalline semiconductor material or an amorphous semiconductor material. The thickness of the disposable gate material layer 27L can be from 30 nm to 300 nm, although lesser and greater thicknesses can also be employed. The disposable gate cap dielectric layer 29L can include a dielectric material such as silicon oxide, silicon nitride, or silicon oxynitride. The thickness of the disposable gate cap dielectric layer 29L can be from 3 nm to 30 nm, although lesser and greater thicknesses can also be employed. While the present disclosure is illustrated with disposable gate level layers including a vertical stack a disposable gate dielectric layer 23L, a disposable gate material layer 27L, and a disposable gate cap dielectric layer 29L, any other disposable gate level layers can also be employed provided that the material(s) in the disposable gate level layers can be removed selective to a planarization dielectric layer to be subsequently formed.

Figure 2:
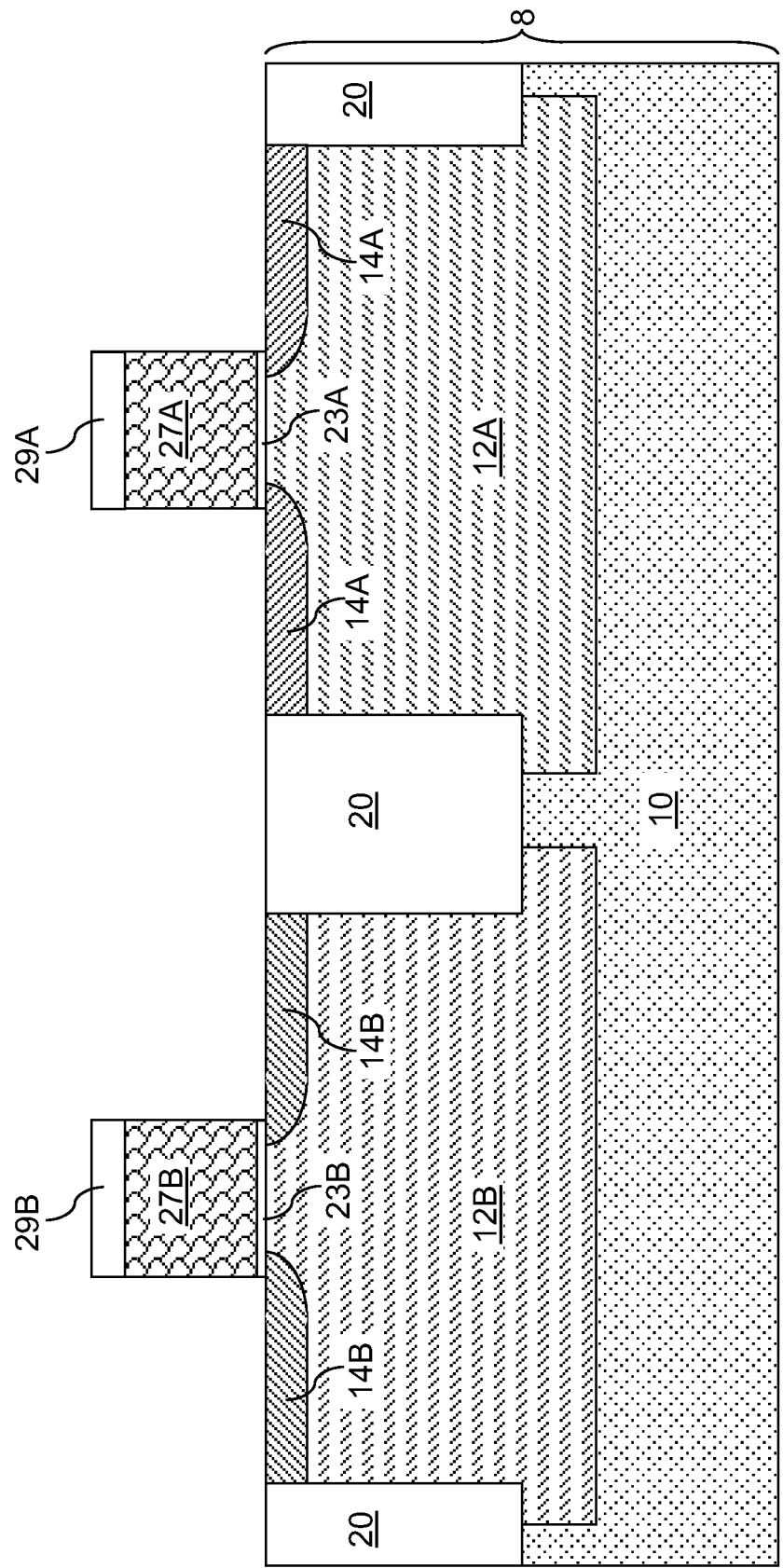
FIG. 2 is a vertical cross-sectional view of the exemplary semiconductor structure after patterning of disposable gate structures and formation of source/drain extension regions according to an embodiment of the present disclosure.

Referring to FIG. 2, the disposable gate level layers (29L, 27L, 23L) are lithographically patterned to form disposable gate structures. Specifically, a photoresist (not shown) is applied over the topmost surface of the disposable gate level layers (29L, 27L, 23L) and is lithographically patterned by lithographic exposure and development. The pattern in the photoresist is transferred into the disposable gate level layers (29L, 27L, 23L) by an etch, which can be an anisotropic etch such as a reactive ion etch. The remaining portions of the disposable gate level layers (29L, 27L, 23L) after the pattern transfer constitute disposable gate structures.

The disposable gate stacks may include, for example, a first disposable gate structure formed over the second conductivity type well 12A in the first device region and a second disposable gate structure formed over the first conductivity type well 12B in the second device region. The first disposable gate structure is a stack of a first disposable gate dielectric portion 23A, a first disposable gate material portion 27A, and a first disposable gate cap portion 29A, and the second disposable gate structure is a stack of a second disposable gate dielectric portion 23B, a second disposable gate material portion 27B, and a second disposable gate cap portion 29B. The first disposable gate cap portion 29A and the second disposable gate cap portion 29B are remaining portions of the disposable gate cap dielectric layer 29L. The first disposable gate material portion 27A and the second disposable gate material portion 27B are remaining portions of the disposable gate material layer 27L. The first disposable gate dielectric portion 23A and the second disposable gate dielectric portion 23B are remaining portions of the disposable gate dielectric layer 23L.

Masked ion implantations can be employed to form various source/drain extension regions. For example, dopants of the first conductivity type can be implanted into portions of the second conductivity type well 12A that are not covered by the first disposable gate structure (23A, 27A, 29A) to form first source/drain extension regions 14A having a doping of the first conductivity type. The first conductivity type well 12B can be masked by a patterned photoresist (not shown) during this implantation process to prevent implantation of additional dopants of the first conductivity type therein. As used herein, "source/drain extension regions" collectively refer to source extension regions and drain extension regions. Similarly, dopants of the second conductivity type can be implanted into portions of the first conductivity type well 12B that are not covered by the second disposable gate structure (23B, 27B, 29B) to form second source/drain extension regions 14B. The second conductivity type well 12A can be masked by another patterned photoresist (not shown) during this implantation process to prevent implantation of dopants of the second conductivity type therein.

Figure 3:
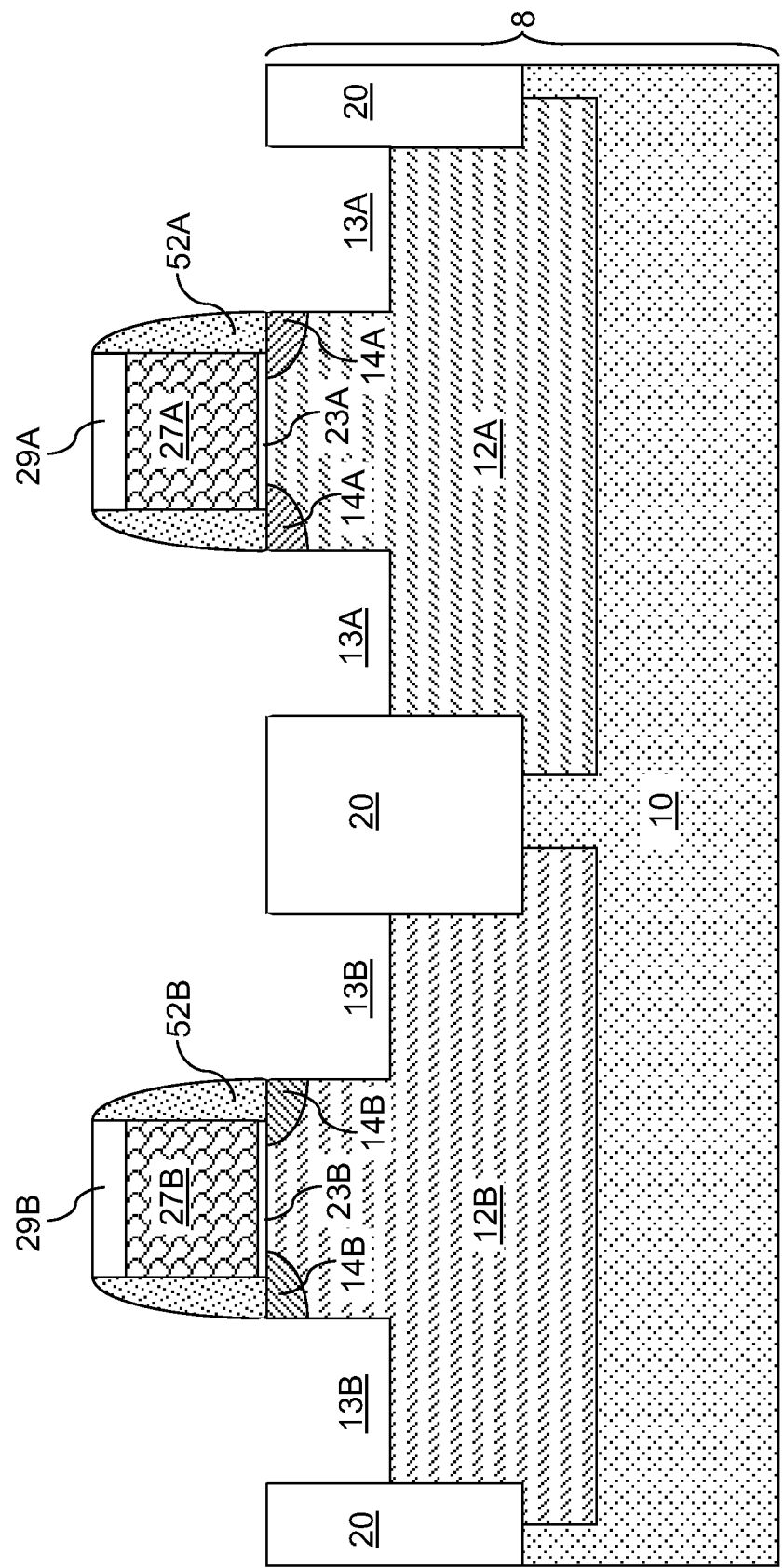
FIG. 3 is a vertical cross-sectional view of the exemplary semiconductor structure after formation of source/drain trenches according to an embodiment of the present disclosure.

Referring to FIG. 3, gate spacers are formed on sidewalls of each of the disposable gate structures, for example, by deposition of a conformal dielectric material layer and an anisotropic etch. The gate spacers can include a first gate spacer 52A formed around the first disposable gate structure (23A, 27A, 29A) and a second gate spacer 52B formed around the second disposable gate structure (23B, 27B, 29B).

In one embodiment, semiconductor material can be removed from the portions of the semiconductor substrate that are not covered by the disposable gate structures, gate spacers (52A, 52B), or the shallow trench isolation structures 20 to form cavities within the semiconductor substrate 8. For example, first source/drain cavities 13A can be formed in the first device region, and second source/drain cavities 13B can be formed in the second device region by an anisotropic etch that removes the semiconductor materials of the second conductivity type well 12A and the first conductivity type well 12B. The depth of the first and second source/drain cavities (13A, 13B) does not exceed the depths of the second conductivity type well 12A and the first conductivity type well 12B, and preferably, does not exceed the depths of the shallow trench isolation structures 20. The first and second source/drain cavities (13A, 13B) can have substantially vertical sidewalls that are vertically coincident with a bottom portion of the outer sidewalls of the gate spacers (52A, 52B).

Figure 4:
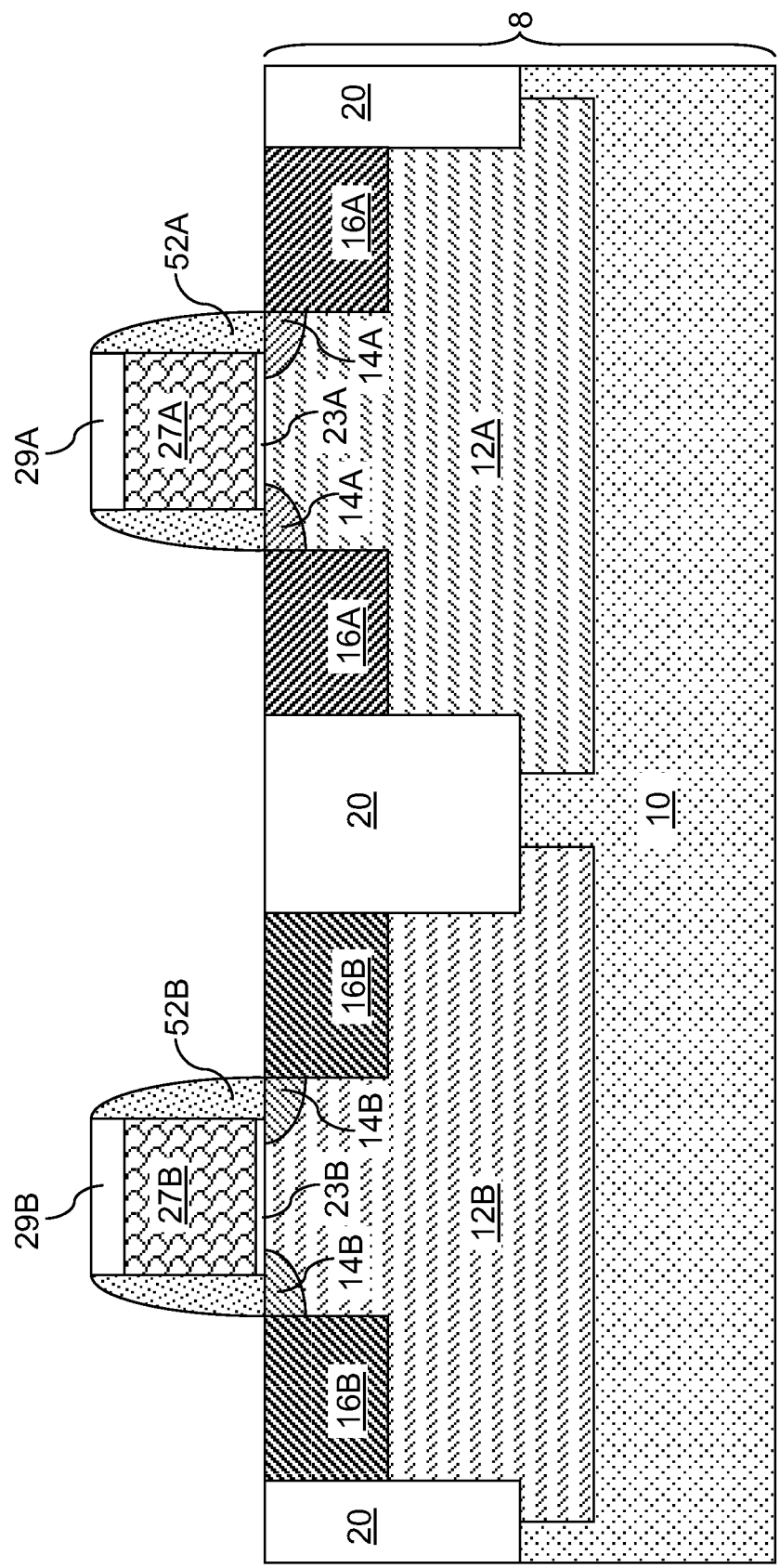
FIG. 4 is a vertical cross-sectional view of the exemplary semiconductor structure after formation of embedded stress-generating source/drain regions according to an embodiment of the present disclosure.

Referring to FIG. 4, a first dielectric liner (not shown) can be deposited and lithographically patterned to cover the second device region, while exposing the semiconductor surfaces on the first source/drain cavities 13A. First embedded stress-generating source/drain regions 16A are formed by selective epitaxy of a semiconductor material that is lattice mismatched relative to the semiconductor material of the second conductivity type well 12A.

For example, if the second conductivity type well 12A includes a p-doped single crystalline silicon and an n-type field effect transistor is to be formed in the second device region, the first embedded stress-generating source/drain regions 16A can include an n-doped single crystalline silicon-carbon alloy material in which the carbon concentration is between 0% and 2.5% in atomic concentration, which is the solubility limit of carbon in silicon. In this case, the first embedded stress-generating source/drain regions 16A apply a longitudinal tensile stress in channel of the n-type field effect transistor along the direction connecting the two first embedded stress-generating source/drain regions 16A. The longitudinal tensile stress along the direction of the channel of the n-type field effect transistor increases the mobility of minority carriers (electrons) in the channel region, and therefore, increases the on-current of the n-type field effect transistor.

Alternately, if the second conductivity type well 12A includes an n-doped single crystalline silicon and a p-type field effect transistor is to be formed in the first device region, the first embedded stress-generating source/drain regions 16A can include a p-doped single crystalline silicon-germanium alloy material, in which the germanium concentration can be between 0% and 30% in atomic concentration. In this case, the first embedded stress-generating source/drain regions 16A apply a longitudinal compressive stress in channel of the p-type field effect transistor along the direction connecting the two first embedded stress-generating source/drain regions 16A. The longitudinal compressive stress along the direction of the channel of the p-type field effect transistor increases the mobility of minority carriers (holes) in the channel region, and therefore, increases the on-current of the p-type field effect transistor.

A second dielectric liner (not shown) can be deposited and lithographically patterned to cover the first device region, while exposing the semiconductor surfaces on the first source/drain cavities 13A. Any remaining portion of the first dielectric liner is removed from the sidewalls and bottom surfaces of the second source/drain cavities 13B so that semiconductor surfaces of the first conductivity type well 12B are exposed at the sidewalls and bottom surfaces of the second source/drain cavities 13B. Second embedded stress-generating source/drain regions 16B are formed by selective epitaxy of a semiconductor material that is lattice mismatched relative to the semiconductor material of the first conductivity type well 12A.

The material of the second embedded stress-generating source/drain regions 16B can provide the opposite type of stress to the type of stress that the first embedded stress-generating source/drain regions 16A generate. Thus, if the first embedded stress-generating source/drain regions 16A generate a longitudinal tensile stress, the second embedded stress-generating source/drain regions 16B generate a longitudinal compressive stress. For example, the first conductivity type well 12B can include an n-doped single crystalline silicon, and the second embedded stress-generating source/drain regions 16B can include a p-doped single crystalline silicon-germanium alloy material, in which the germanium concentration can be between 0% and 30% in atomic concentration.

Alternately, if the first embedded stress-generating source/drain regions 16A generate a longitudinal compressive stress, the second embedded stress-generating source/drain regions 16B generate a longitudinal tensile stress. For example, the first conductivity type well 12B can include a p-doped single crystalline silicon, and the second embedded stress-generating source/drain regions 16B can include an n-doped single crystalline silicon-carbon alloy material, in which the carbon concentration can be between 0% and 2.5% in atomic concentration.

The topmost surfaces of the first and second embedded stress-generating source/drain regions 16A can be raised above, coplanar with, or recessed below, the plane of the bottom surfaces of the first and second disposable gate dielectric portions (23A, 23B) depending on the amount of the epitaxial material selectively deposited in the first and second source/drain cavities (13A, 13B).

Each of the first embedded stress-generating source region (one of 16A's) and the first embedded stress-generating drain region (the other of 16A's) is epitaxially aligned to a single crystalline semiconductor material of the second conductivity type well 12A, which subsequently functions as a body of a first field effect transistor. Each of the second embedded stress-generating source region (one of 16B's) and the second embedded stress-generating drain region (the other of 16B's) is epitaxially aligned to a single crystalline semiconductor material of the first conductivity type well 12B, which subsequently functions as a body of a second field effect transistor.

While the present disclosure is illustrated with an embodiment in which embedded stress-generating source/drain regions (16A, 16B) are employed, embodiments in which one or more of the embedded stress-generating source/drain regions (16A, 16B) are replaced with (a) source/drain region(s) that are formed by ion implantation of dopants can also be practiced. In such embodiment, dopants of the first conductivity type are implanted into portions of the second conductivity type well 12A that are not covered by the first disposable gate structure (23A, 27A, 29A) and the first gate spacer 52A to form first source and drain regions having a doping of the first conductivity type. The first conductivity type well 12B can be masked by a photoresist (not shown) during the implantation of the first conductivity type dopants to prevent implantation of the first conductivity type dopants therein. Similarly, dopants of the second conductivity type are implanted into portions of the first conductivity type well 12B that are not covered by the second disposable gate structure (23B, 27B, 29B) and the second gate spacer 52B to form second source and drain regions having a doping of the second conductivity type. The second conductivity type well 12A can be masked by a photoresist (not shown) during the implantation of the second conductivity type dopants to prevent implantation of the second conductivity type dopants therein.

Figure 5:
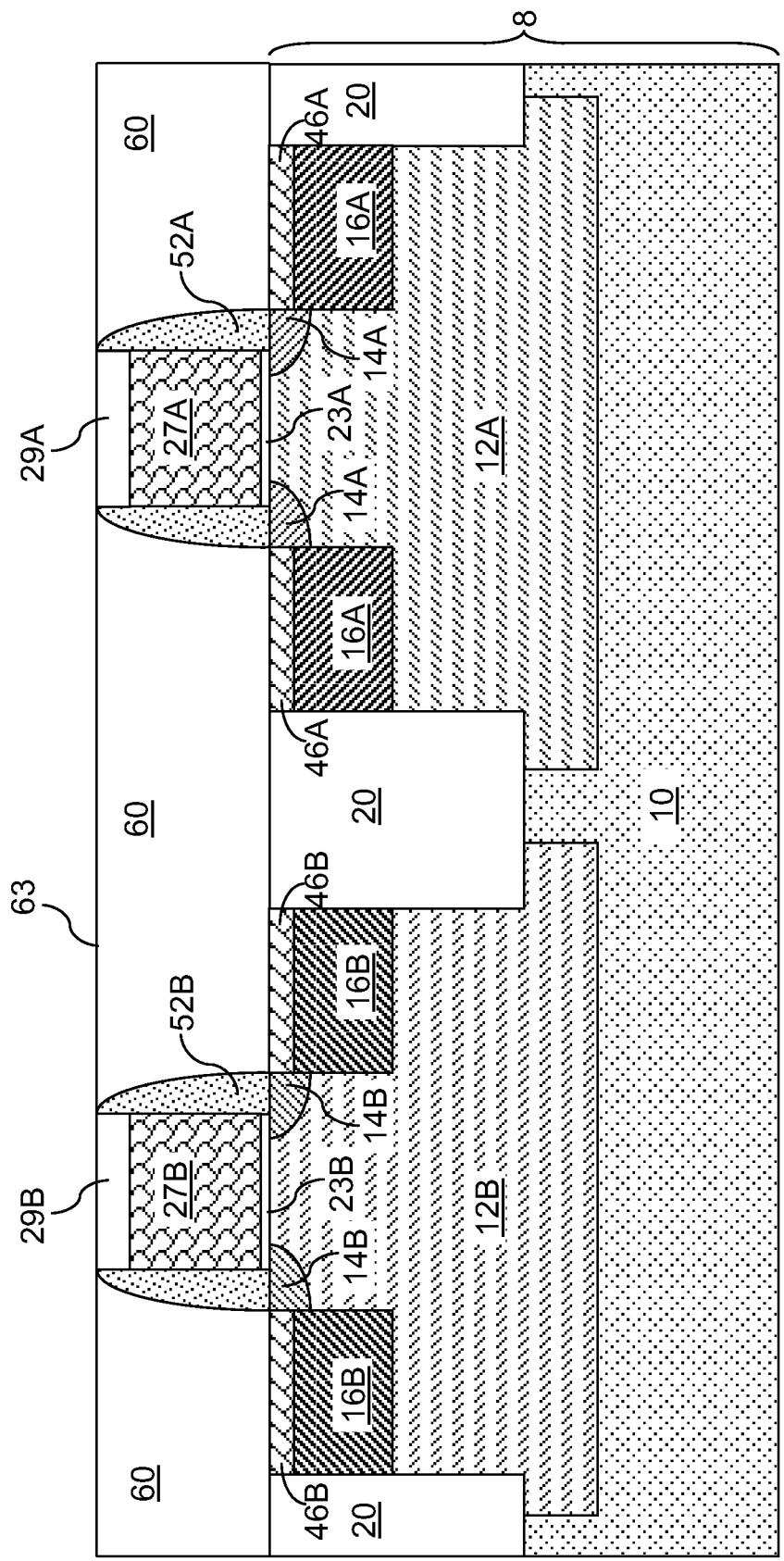
FIG. 5 is a vertical cross-sectional view of the exemplary semiconductor structure after deposition and planarization of a planarization dielectric layer according to an embodiment of the present disclosure.

Referring to FIG. 5, first metal semiconductor alloy portions 46A and second metal semiconductor alloy portions 46B can be formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy portions (46A, 46B), which can include a metal silicide portions if the semiconductor material of the first and second embedded stress-generating source and drain regions (16A, 16B) include silicon.

The various metal semiconductor alloy portions (46A, 46B) include a first source-side metal semiconductor alloy portion (one of 46A's) formed on the first embedded stress-generating source region (one of 16A's), a first drain-side metal semiconductor alloy portion (the other of 16A's) formed on the first embedded stress-generating drain region (the other of 16A's), a second source-side metal semiconductor alloy portion (one of 46B's) formed on the second embedded stress-generating source region (one of 16B's), and a second drain-side metal semiconductor alloy portion (the other of 16B's) formed on the second embedded stress-generating drain region (the other of 16B's).

Optionally, a dielectric liner (not shown) may be deposited over the metal semiconductor alloy portions (46A, 46B), the first and second disposable gate structures (23A, 27A, 29A, 23B, 27B, 29B), and the first and second gate spacers (52A, 52B). Optionally, a first stress-generating liner (not shown) and a second stress-generating liner (not shown) can be formed over the first disposable gate structure (23A, 27A, 29A) and the second disposable gate structure (23B, 27B, 29B), respectively. The first stress-generating liner and the second stress-generating liner can include a dielectric material that generates a compressive stress or a tensile stress to underlying structures, and can be silicon nitride layers deposited by plasma enhanced chemical vapor deposition under various plasma conditions.

A planarization dielectric layer 60 can be deposited over the first stress-generating liner and/or the second stress-generating liner, if present, or over the metal semiconductor alloy portions (46A, 46B), the first and second disposable gate structures (23A, 27A, 29A, 23B, 27B, 29B), and the first and second gate spacers (52A, 52B) if (a) stress-generating liner(s) is/are not present. Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60 and any additional dielectric material layers (which include any of the first stress-generating liner, the second stress-generating liner, and the dielectric liner that are present, are planarized above the topmost surfaces of the first and second disposable gate structures (23A, 27A, 29A, 23B, 27B, 29B), i.e., above the topmost surfaces of the first and second disposable gate cap portions (29A, 29B). The planarization can be performed, for example, by chemical mechanical planarization (CMP). The planar topmost surface of the planarization dielectric layer 60 is herein referred to as a planar dielectric surface 63. The topmost surfaces of the disposable gate cap portions (29A, 29B) are coplanar with the planar dielectric surface 63 after the planarization.

The combination of the first source and drain extension regions 14A, the first embedded stress-generating source and drain regions 16A, and the second conductivity type well 12A can be employed to subsequently form a first field effect transistor. The combination of the second source and drain extension regions 14B, the second embedded stress-generating source and drain regions 16B, and the first conductivity type well 12B can be employed to subsequently form a second type field effect transistor.

Figure 6:
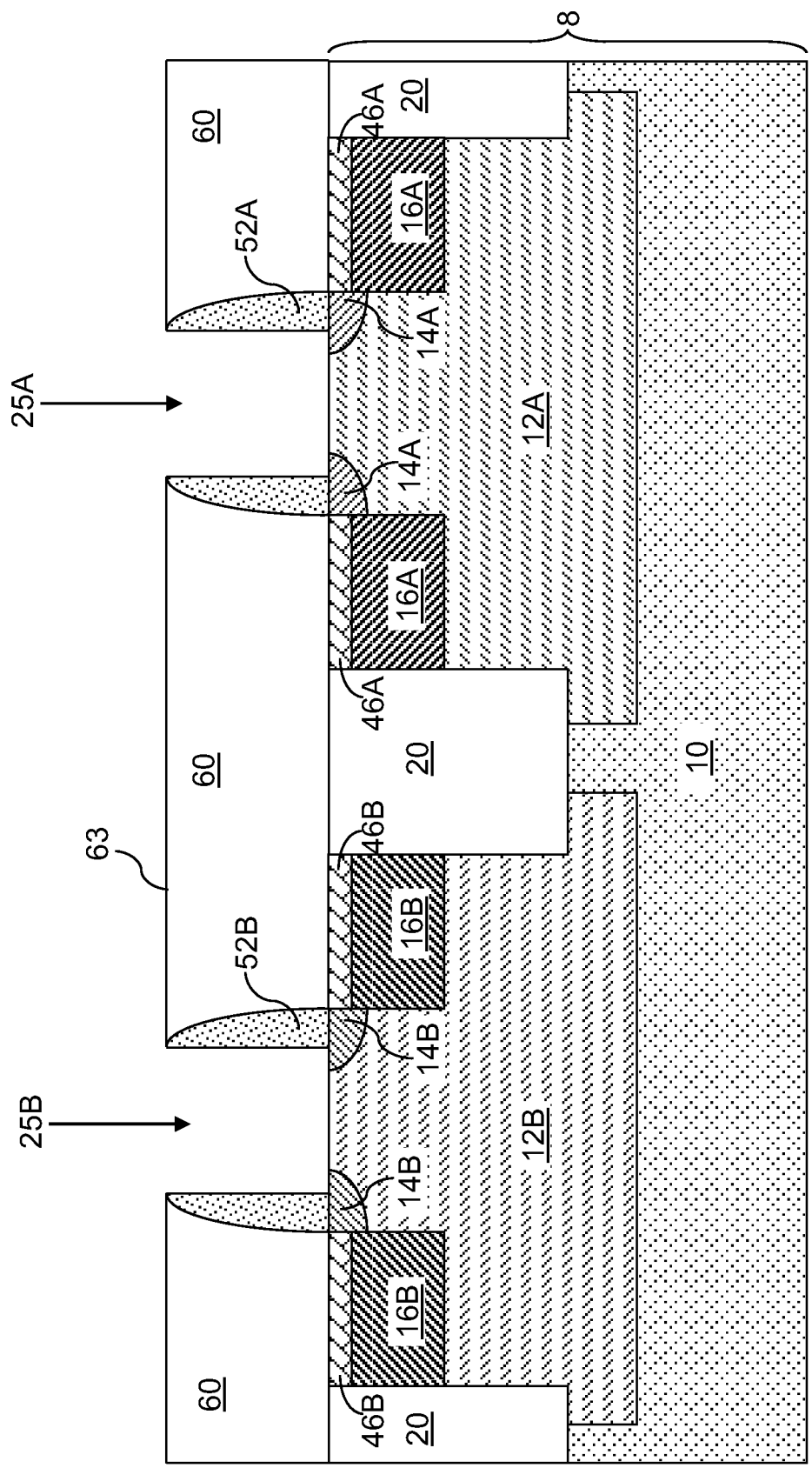
FIG. 6 is a vertical cross-sectional view of the exemplary semiconductor structure after removal of the disposable gate structures according to an embodiment of the present disclosure.

Referring to FIG. 6, the first disposable gate structure (23A, 27A, 29A) and the second disposable gate structure (23B, 27B, 29B) are removed by at least one etch. The first and second disposable gate structures (23A, 27A, 29A, 23B, 27B, 29B) can be removed, for example, by at least one etch, which can include an anisotropic etch, an isotropic etch, or a combination thereof. The at least one etch can include a dry etch and/or a wet etch. The at least one etch employed to remove the first and second disposable gate structures (23A, 27A, 29A, 23B, 27B, 29B) is preferably selective to the dielectric materials of the planarization dielectric layer 60 and any other dielectric material layer that is present above the semiconductor substrate 8.

A first gate cavity 25A is formed in the volume from which the first disposable gate structure (23A, 27A, 29A) is removed, and a second gate cavity 25B is formed in the volume from which the second disposable gate structure (23B, 27B, 29B) is removed. A semiconductor surface of the semiconductor substrate 8, i.e., the top surface of the second conductivity type well 12A, is exposed at the bottom of the first gate cavity 25A. Another semiconductor surface of the semiconductor substrate 8, i.e., the top surface of the first conductivity type well 12B, is exposed at the bottom of the second gate cavity 25B. Each of the first and second gate cavities (25A, 25B) is laterally surrounded by the planarization dielectric layer 60. The first gate spacer 52A laterally surrounds the first gate cavity 25A, and the second gate spacer 52B laterally surrounds the second gate cavity 25B. The inner sidewalls of the first gate spacer 52A can be substantially vertical, and extends from the top surface of the second conductivity type well 12A to the planar dielectric surface 63, i.e., the topmost surface, of the planarization dielectric layer 60. Further, the inner sidewalls of the second gate spacer 52B can be substantially vertical, and extends from the top surface of the first conductivity type well 12B to the planar dielectric surface 63 of the planarization dielectric layer 60.

Figure 7:
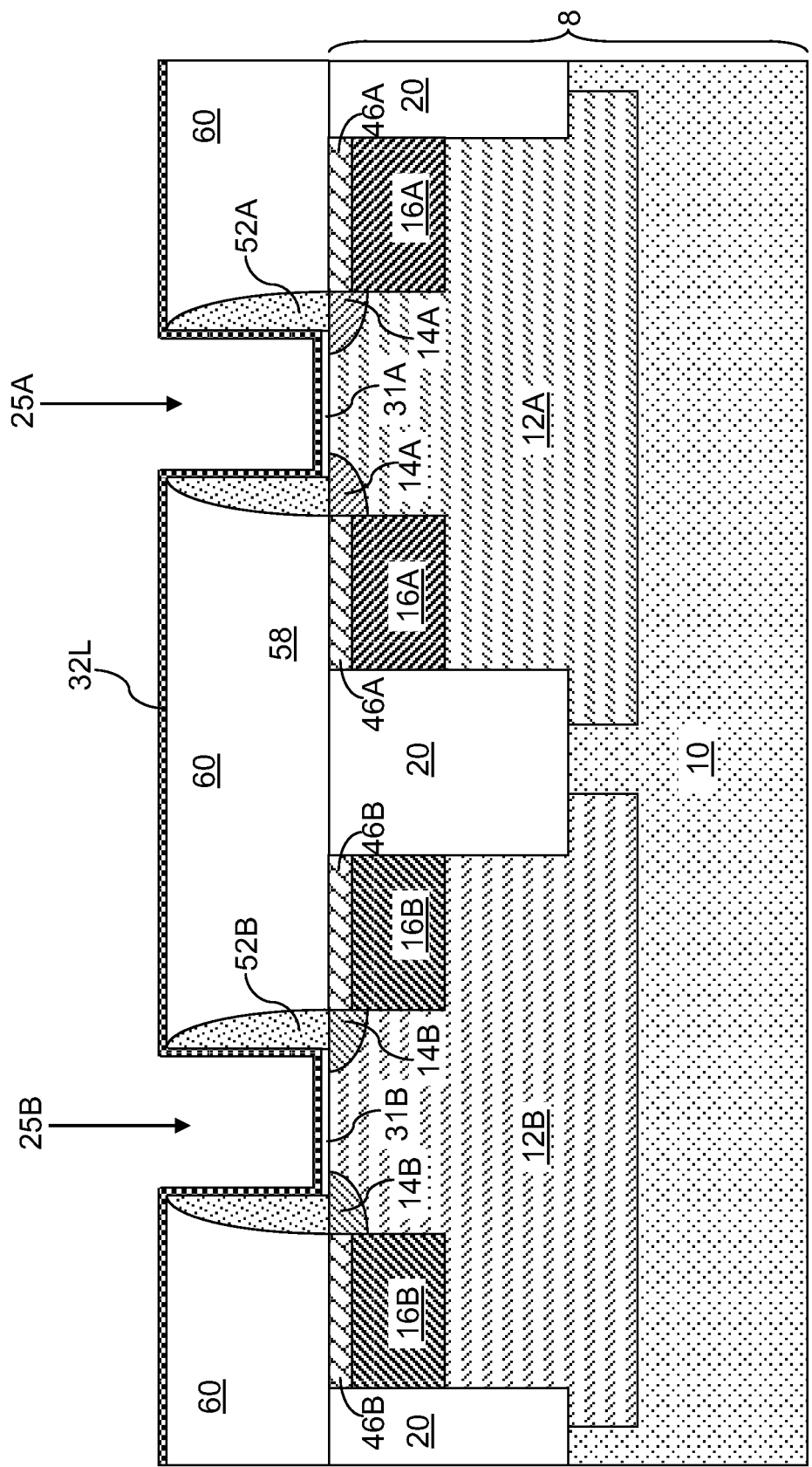
FIG. 7 is a vertical cross-sectional view of the exemplary semiconductor structure after formation of a gate dielectric layer according to an embodiment of the present disclosure.

Referring to FIG. 7, exposed portions of the semiconductor surfaces of the semiconductor substrate 8 can be converted to a dielectric material layer. For example, a first semiconductor-element-containing dielectric layer 31A can be formed on the exposed surface of the second conductivity type well 12A by conversion of the exposed semiconductor material into a dielectric material, and a second semiconductor-element-containing dielectric layer 31B can be formed on the exposed surface of the first conductivity type well 12B by conversion of the exposed semiconductor material into the dielectric material. The formation of the semiconductor-element-containing dielectric layers (31A, 31B) can be effected by thermal conversion or plasma treatment. If the semiconductor material of the second conductivity type well 12A and the first conductivity type well 12B includes silicon, the semiconductor-element-containing dielectric layers (31A, 31B) can include silicon oxide or silicon nitride. The semiconductor-element-containing dielectric layers (31A, 31B) are interfacial dielectric layers that contact a semiconductor surface underneath and gate dielectrics to be subsequently deposited thereupon. The thickness of the semiconductor-element-containing dielectric layers (31A, 31B) can be from 0.3 nm to 1.2 nm, although lesser and greater thicknesses can also be employed.

A gate dielectric layer 32L is deposited on the bottom surfaces and sidewalls of the gate cavities (25A, 25B) and the topmost surface of the planarization dielectric layer 60. The gate dielectric layer 32L can be a high dielectric constant (high-k) material layer having a dielectric constant greater than 8.0. The gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAiO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 32L, as measured at horizontal portions, can be from 0.9 nm to 6 nm, and preferably from 1.0 nm to 3 nm. The gate dielectric layer 32L may have an effective oxide thickness on the order of or less than 1 nm. In one embodiment, the gate dielectric layer 32L is a hafnium oxide ($HfO_2$) layer.

Figure 8:
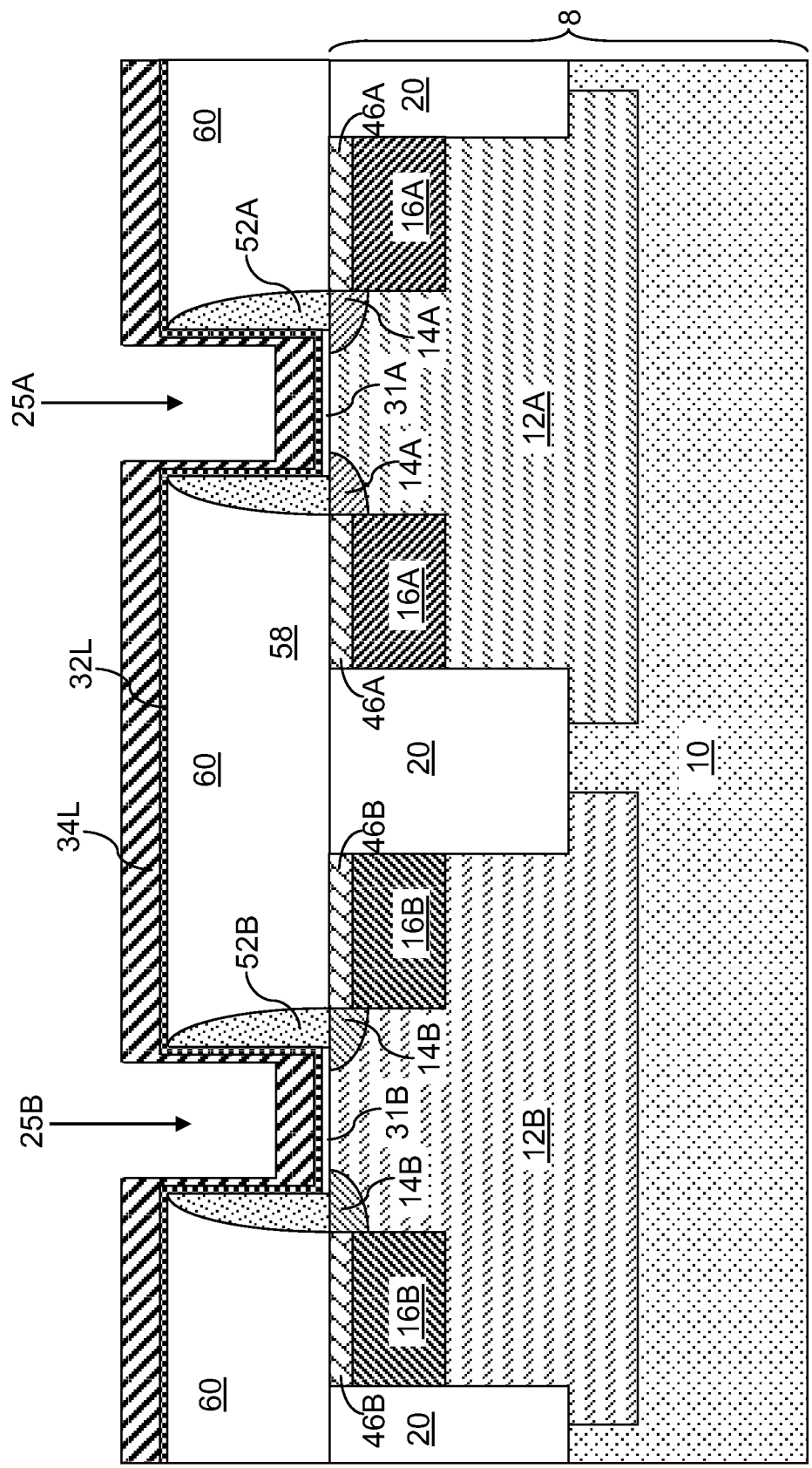
FIG. 8 is a vertical cross-sectional view of the exemplary semiconductor structure after formation of a first work function material layer according to an embodiment of the present disclosure.

Referring to FIG. 8, a first work function material layer 34L is deposited employing an anisotropic deposition method. The first work function material layer 34L includes a first metallic material having a first work function.

For example, if the second conductivity type well 12A includes a p-doped single crystalline semiconductor material and the second device region includes an n-type field effect transistor, the first metallic material can have a work function that is closer to the conduction band energy level of the semiconductor material than to the valence band energy level of the semiconductor material. If the second conductivity type well 12A includes p-doped single crystalline silicon and the second device region includes an n-type field effect transistor, the first metallic material can have a work function between the conduction band energy level of silicon and the mid-band gap energy level, i.e., the energy level at the middle between the valence band edge and the conduction band edge of silicon. In this case, the first metallic material can include Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, a stack thereof, a conductive oxide thereof, a conductive nitride thereof, an alloy thereof, and a combination thereof.

If the second conductivity type well 12A includes an n-doped single crystalline semiconductor material and the second device region includes a p-type field effect transistor, the first metallic material can have a work function that is closer to the valence band energy level of the semiconductor material than to the conduction band energy level of the semiconductor material. If the second conductivity type well 12A includes n-doped single crystalline silicon and the second device region includes a p-type field effect transistor, the first metallic material can have a work function between the valence band energy level of silicon and the mid-band gap energy level of silicon. In this case, the first metallic material can include Pt, Rh, Ir, Ru, Cu, Os, Be, Co, Pd, Te, Cr, Ni, TiN, a stack thereof, a conductive oxide thereof, a conductive nitride thereof, an alloy thereof, and a combination thereof.

The anisotropic deposition method employed to deposit the first work function material layer 34L can be any method that provides a directional deposition so that more first metallic material is deposited on horizontal surfaces than on vertical surfaces. For example, the anisotropic deposition method can be a collimated physical vapor deposition (PVD) method, in which the first metallic material is directed downward in directions substantially parallel to the vertical direction of the exemplary semiconductor structure. Alternately, the anisotropic deposition method can employ radio frequency physical vapor deposition (RFPVD) sputtering and/or with constant voltage substrate bias, i.e., constant electrical voltage bias applied to the substrate.

In one embodiment, the angular spread of the directions of the particles of the first metallic material that are sputtered toward the exemplary semiconductor structure is less than 30 degrees from the vertical direction, i.e., the direction perpendicular to the topmost surface of the planarization dielectric layer 30, and preferably less than 15 degrees from the vertical direction, and more preferably less than 7.5 degrees from the vertical direction.

The anisotropy inherent in the deposition method causes the vertical portions of the first work function material layer 34L to have a lesser thickness than horizontal portions of the first work function material layer 34L. The ratio of the thickness of the horizontal portions of the first work function material layer 34L at the bottom of the first and second gate cavities (25A, 25B) to the thickness of the vertical portions of the first work function material layer 34L on the sidewalls of the first and second gate cavities (25A, 25B) can be greater than 3.0:1, and preferably greater than 4.0:1. Thus, the horizontal portions of the first work function material layer 34L have a thickness that is at least three times the thickness of the first vertical portions of the work function material layer 34L. Experimental collimated PVD methods performed for the purpose of the present disclosure have demonstrated ratios ranging from 4:1 to 5:1.

The thickness of the horizontal portions of the first work function material layer 34L at the bottom of the first and second gate cavities (25A, 25B) can be from 3 nm to 15 nm, although lesser and greater thicknesses can also be employed.

Figure 9:
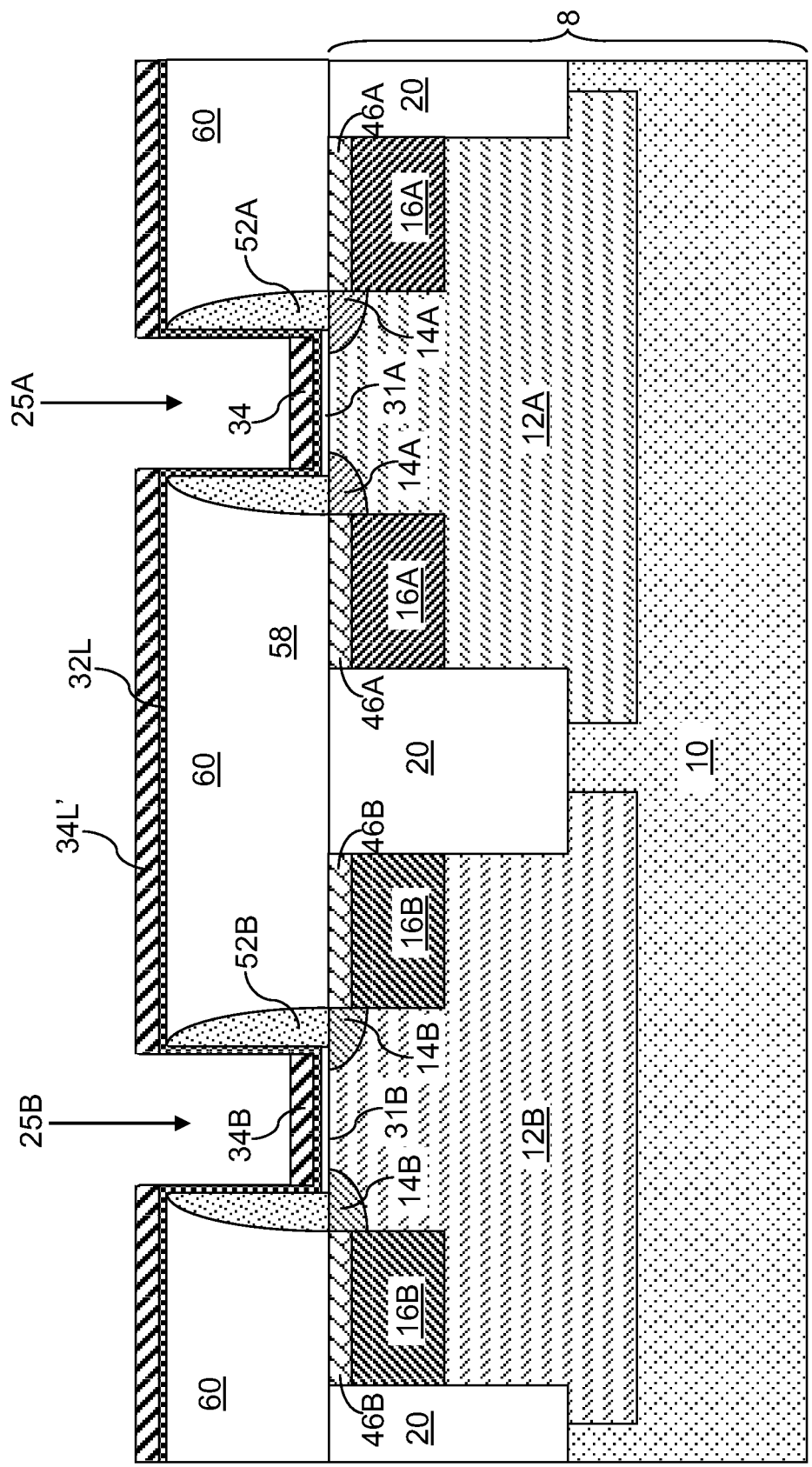
FIG. 9 is a vertical cross-sectional view of the exemplary semiconductor structure after a first etch back process according to an embodiment of the present disclosure.

Referring to FIG. 9, a first etch back process is performed to remove vertical portions of the first work function material layer 34L. The first etch back process can be an isotropic etch. For example, the first etch back process can be a wet etch that etches all exposed surface portions of the first work function material layer 34L at a same etch rate. Alternately, the first etch back process can be a gas phase etch. The vertical portions of the first work function material layer 34L and upper portions of horizontal portions of the first work function material layer 34L are removed by the isotropic etch.

The duration of the first etch back process is set such that all vertical portions of the first work function material layer 34L are removed, while horizontal portions of the first work function material layer 34L are not completely removed. A remaining horizontal portion of the first work function material layer 34L within the first cavity 25A is herein referred to as a first planar work function material portion 34, and a remaining horizontal portion of the first work function material layer within the second cavity 25B is herein referred to as a disposable work function material portion 34B, which is removed in a subsequent processing step. A remaining horizontal portion of the first work function material layer 34L above the planarization dielectric layer 60 is herein referred to as a first planar work function metal layer 34L', which has a uniform thickness throughout.

The first planar work function material portion 34 has a topmost surface that is recessed from the topmost surface of the planarization dielectric layer 60. The first planar work function material portion 34 is formed in the first gate cavity 25A and directly on a top surface and on a bottom portion of inner sidewall surfaces of the gate dielectric layer 32L. The first planar work function material portion 34 can have a uniform thickness between one inner vertical sidewall of the gate dielectric layer 32L and another inner vertical sidewall of the gate dielectric layer 32L within the first gate cavity 25A. Inner sidewalls of the gate dielectric layer 32L are exposed above the first planar work function material portion 34 and the disposable work function material portion 34B within the first gate cavity 25A and the second gate cavity 25B, respectively.

The thickness of the first planar work function material portion 34 at the bottom of the first gate cavity 25A and the disposable work function material portion 34B are the same, and can be from 2.5 nm to 10 nm, although lesser and greater thicknesses can also be employed.

Figure 10:
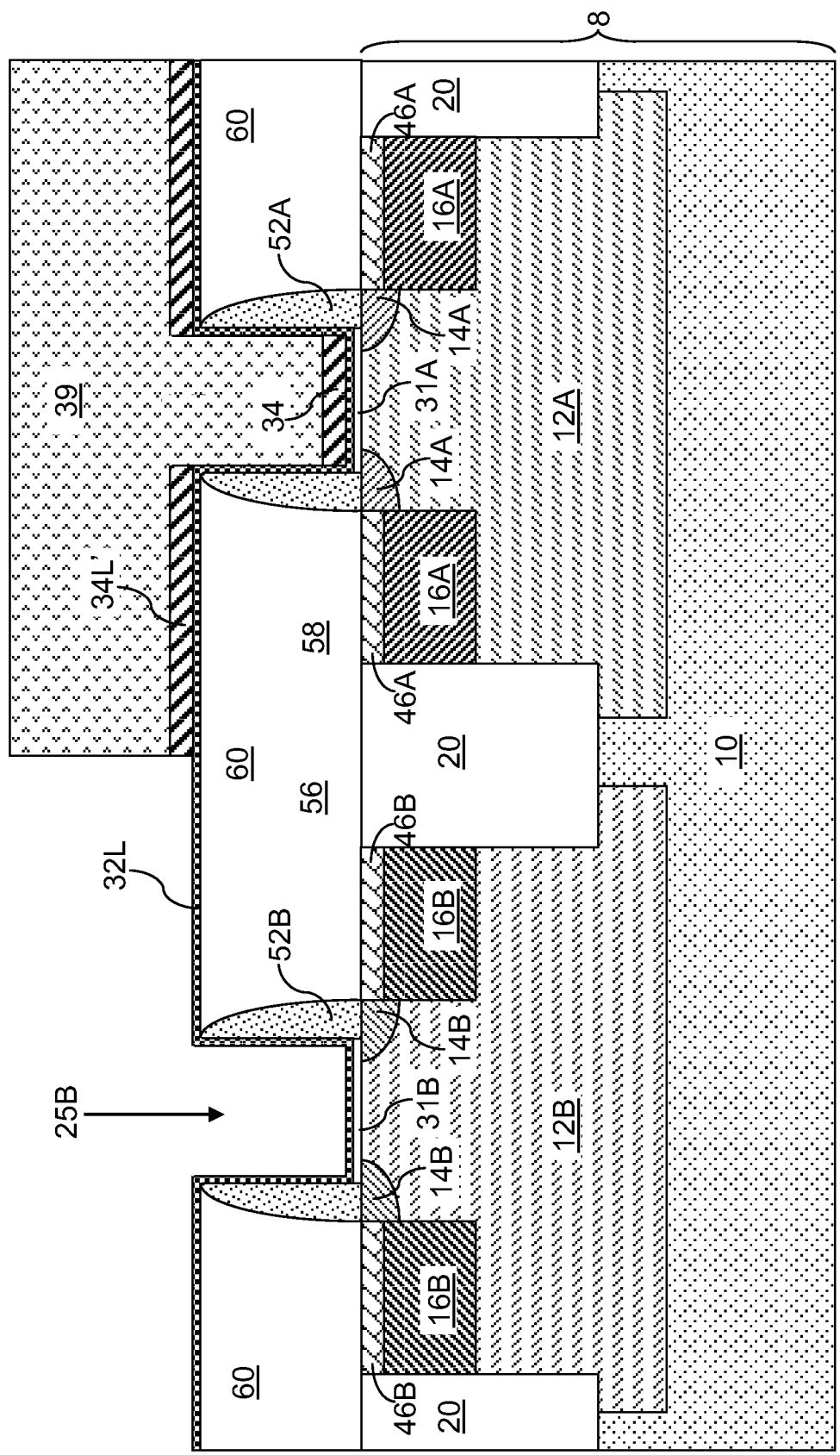
FIG. 10 is a vertical cross-sectional view of the exemplary semiconductor structure after removal of remaining portions of the first work function material layer from a second type field effect transistor region according to an embodiment of the present disclosure.

Referring to FIG. 10, a photoresist 39 is applied and lithographic patterned so that the photoresist 39 covers the area over the second conductivity type well 12A, while the disposable work function material portion 34B and a portion of the first planar work function metal layer 34L' are exposed over the first conductivity type well 12B. The disposable work function material portion 34B and the exposed portion of the first planar work function metal layer 34L' are removed by an etch, which can be a wet etch or a dry etch. The photoresist 39 is removed, for example, by ashing or wet etching.

Figure 11:
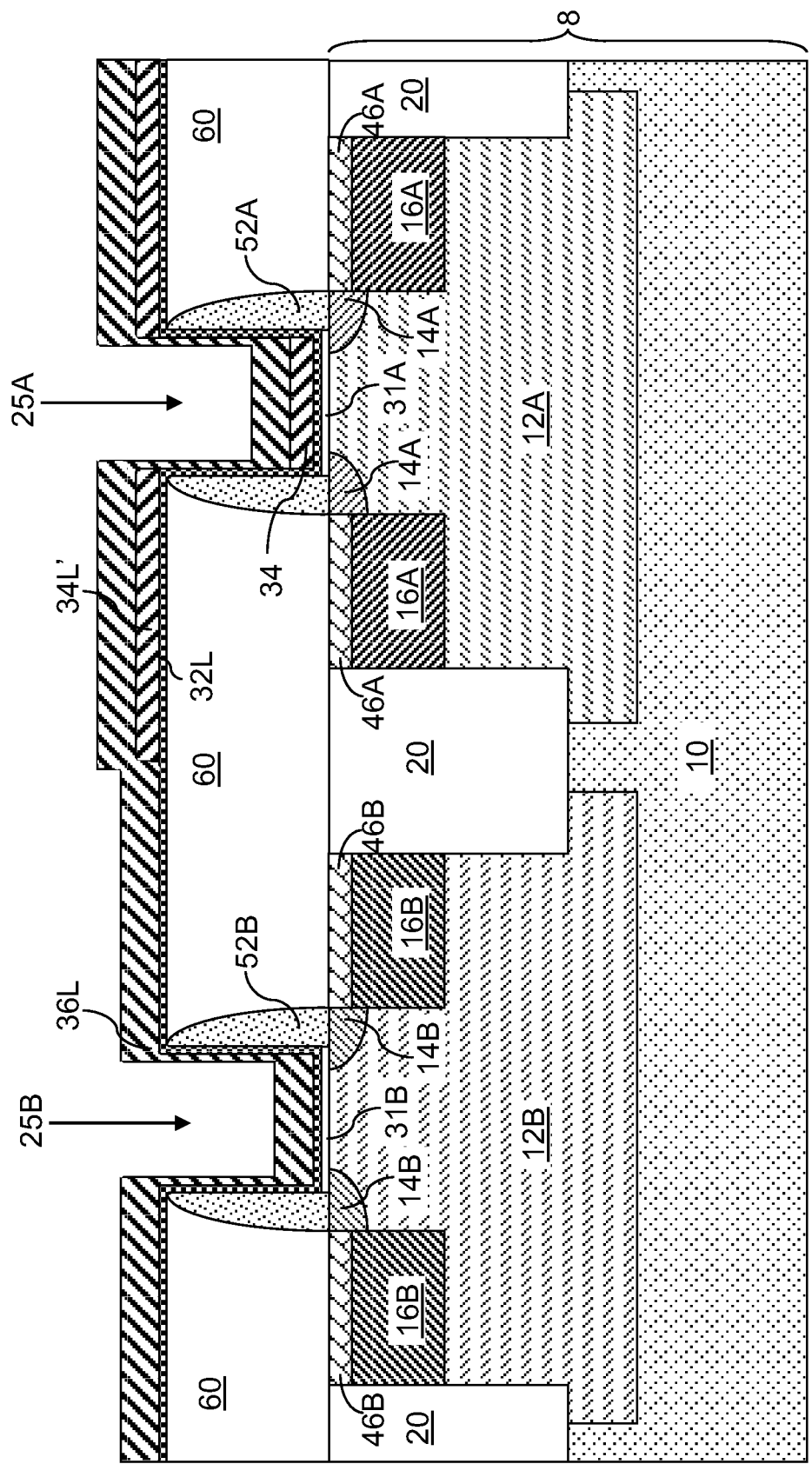
FIG. 11 is a vertical cross-sectional view of the exemplary semiconductor structure after formation of a second work function material layer according to an embodiment of the present disclosure.

Referring to FIG. 11, a second work function material layer 36L is deposited employing an anisotropic deposition method. The second work function material layer 36L includes a second metallic material having a second work function.

For example, if the first conductivity type well 12B includes an n-doped single crystalline semiconductor material and the first device region includes a p-type field effect transistor, the second metallic material can have a work function that is closer to the valence band energy level of the semiconductor material than to the conduction band energy level of the semiconductor material. If the first conductivity type well 12B includes n-doped single crystalline silicon and the first device region includes a p-type field effect transistor, the second metallic material can have a work function between the valence band energy level of silicon and the mid-band gap energy level of silicon. In this case, the second metallic material can include Pt, Rh, Ir, Ru, Cu, Os, Be, Co, Pd, Te, Cr, Ni, TiN, a stack thereof, a conductive oxide thereof, a conductive nitride thereof, an alloy thereof, and a combination thereof.

If the first conductivity type well 12B includes a p-doped single crystalline semiconductor material and the second device region includes an n-type field effect transistor, the second metallic material can have a work function that is closer to the conduction band energy level of the semiconductor material than to the valence band energy level of the semiconductor material. If the first conductivity type well 12B includes p-doped single crystalline silicon and the second device region includes an n-type field effect transistor, the second metallic material can have a work function between the conduction band energy level of silicon and the mid-band gap energy level of silicon. In this case, the second metallic material can include Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, a stack thereof, a conductive oxide thereof, a conductive nitride thereof, an alloy thereof, and a combination thereof.

The anisotropic deposition method employed to deposit the second work function material layer 36L can be any method that provides a directional deposition so that more second metallic material is deposited on horizontal surfaces than on vertical surfaces. For example, the anisotropic deposition method can be a collimated physical vapor deposition (PVD) method, in which the second metallic material is directed downward in directions substantially parallel to the vertical direction of the exemplary semiconductor structure.

In one embodiment, the angular spread of the directions of the particles of the second metallic material that are sputtered toward the exemplary semiconductor structure is less than 30 degrees from the vertical direction, i.e., the direction perpendicular to the topmost surface of the planarization dielectric layer 30, and preferably less than 15 degrees from the vertical direction, and more preferably less than 7.5 degrees from the vertical direction.

The anisotropy inherent in the deposition method causes the vertical portions of the second work function material layer 36L to have a lesser thickness than horizontal portions of the second work function material layer 36L. The ratio of the thickness of the horizontal portions of the second work function material layer 36L at the bottom of the first and second gate cavities (25A, 25B) to the thickness of the vertical portions of the second work function material layer 36L on the sidewalls of the first and second gate cavities (25A, 25B) can be greater than 3.0:1, and preferably greater than 4.0:1. Thus, the horizontal portions of the second work function material layer 36L have a thickness that is at least three times the thickness of the vertical portions of the second work function material layer 36L.

The thickness of the horizontal portions of the second work function material layer 36L at the bottom of the first and second gate cavities (25A, 25B) can be from 3 nm to 15 nm, although lesser and greater thicknesses can also be employed.

Figure 12:
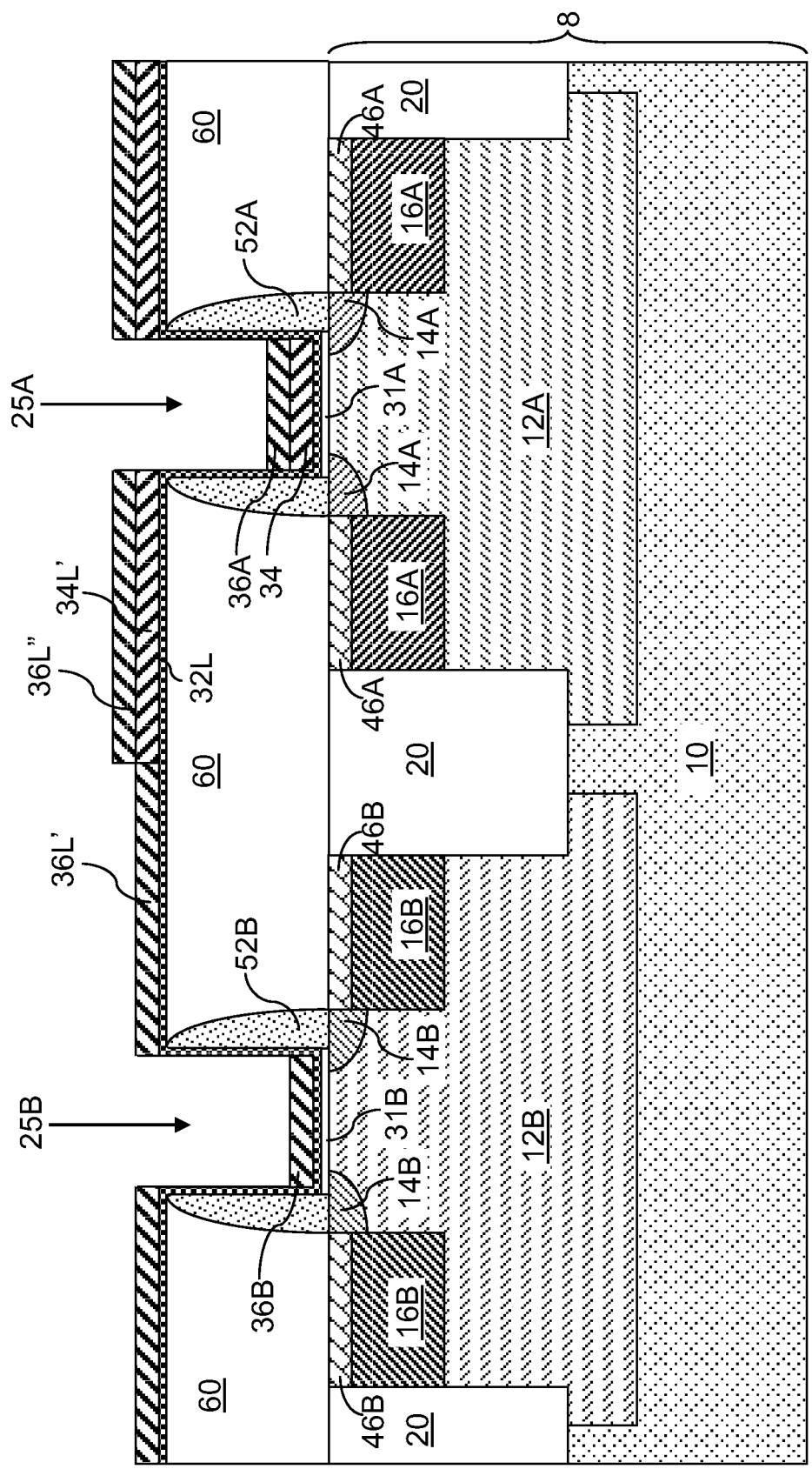
FIG. 12 is a vertical cross-sectional view of the exemplary semiconductor structure after a second etch back process according to an embodiment of the present disclosure.

Referring to FIG. 12, a second etch back process is performed to remove vertical portions of the second work function material layer 36L. The second etch back process can be an isotropic etch. For example, the second etch back process can be a wet etch that etches all exposed surface portions of the second work function material layer 36L at a same etch rate. The vertical portions of the second work function material layer 36L and upper portions of horizontal portions of the second work function material layer 36L are removed by the isotropic etch.

The duration of the second etch back process is set such that all vertical portions of the second work function material layer 36L are removed, while horizontal portions of the second work function material layer 36L are not completely removed. A remaining horizontal portion of the second work function material layer 36L within the first cavity 25A is herein referred to as a second planar work function material portion 36A, and a remaining horizontal portion of the second work function material layer within the second cavity 25B is herein referred to as a planar work function material portion 36B. A first remaining horizontal portion of the second work function material layer 36L contacts the gate dielectric layer 32L in the second device region, and a second remaining horizontal portion of the second work function material layer 36L contacts the top surface of the first planar work function metal layer 34L'. The first remaining horizontal portion of the second work function material layer 36L is herein referred to as a lower second planar work function metal layer 36L', and the second remaining horizontal portion of the second work function material layer 36L is herein referred to as an upper second planar work function metal layer 36L". The lower second planar work function metal layer 36L' and the upper second planar work function metal layer 36L" have a uniform thickness throughout. The lower second planar work function metal layer 36L' may, or may not, be contiguous with the upper second planar work function metal layer 36L" depending on duration of the second etch back process.

The second planar work function material portion 36A has a topmost surface that is recessed from the topmost surface of the planarization dielectric layer 60. The second planar work function material portion 36A is formed in the first gate cavity 25A and directly on the top surface of the first planar work function material portion 34. Further, the second planar work function material portion 36A contacts a portion of inner sidewall surfaces of the gate dielectric layer 32L within the first gate cavity 25A. The second planar work function material portion 36A can have a uniform thickness between one inner vertical sidewall of the gate dielectric layer 32L and another inner vertical sidewall of the gate dielectric layer 32L within the first gate cavity 25A. Inner sidewalls of the gate dielectric layer 32L are exposed above the second planar work function material portion 36A within the first gate cavity 25A.

The planar work function material portion 36B has a topmost surface that is recessed from the topmost surface of the planarization dielectric layer 60. The planar work function material portion 36B is formed in the second gate cavity 25B and directly on the top surface of the gate dielectric layer 32L within the second gate cavity 25B. Further, the planar work function material portion 36B contacts a bottom portion of inner sidewall surfaces of the gate dielectric layer 32L within the second gate cavity 25B. The second planar work function material portion 36B can have a uniform thickness between one inner vertical sidewall of the gate dielectric layer 32L and another inner vertical sidewall of the gate dielectric layer 32L within the second gate cavity 25B. Inner sidewalls of the gate dielectric layer 32L are exposed above the planar work function material portion 36B within the second gate cavity 25B.

Thus, at least one planar work function material portion, i.e., the planar work function material portion 36B or the combination of the first planar work function material portion 34 and the second planar work function material portion 36A, having a topmost surface that is recessed from the topmost surface of the planarization dielectric layer 60 is formed on the gate dielectric layer 32L in each of the first and second gate cavities (25A, 25B). Each of the at least one planar work function can have a uniform thickness between one inner vertical sidewall of the gate dielectric layer 32L and another inner vertical sidewall of the gate dielectric layer 32L.

The thickness of the second planar work function material portion 36A at the bottom of the first gate cavity 25A and the planar work function material portion 36A at the bottom of the second gate cavity 25B can be the same, and can be from 2.5 nm to 10 nm, although lesser and greater thicknesses can also be employed.

Figure 13:
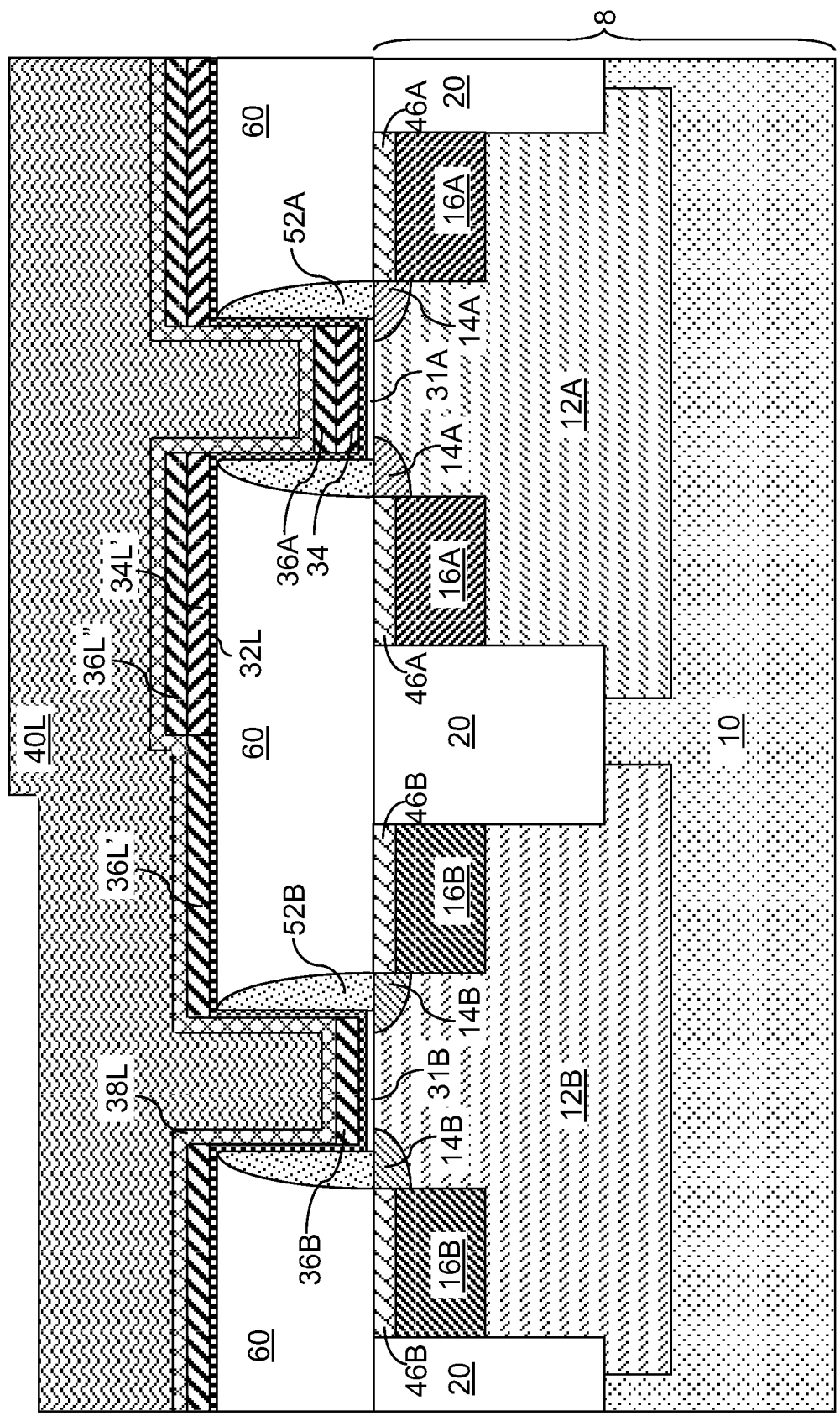
FIG. 13 is a vertical cross-sectional view of the exemplary semiconductor structure after deposition of a conductive fill layer according to an embodiment of the present disclosure.

Referring to FIG. 13, an optional barrier metal layer 38L can be deposited on the exposed surfaces of the lower second planar work function metal layer 36L', the upper second planar work function metal layer 36L", the second planar work function material portion 34A, the planar work function material portion 34B, and the sidewalls of the gate dielectric layer 32L within the first and second gate cavities (25A, 25B). In a non-limiting illustrative example, the optional barrier metal layer 38L can include a tantalum nitride layer, a titanium nitride layer, a titanium-aluminum alloy, or a combination thereof. The thickness of the optional barrier metal layer 38L can be from 0.5 nm to 20 nm, although lesser and greater thicknesses can also be employed. The optional barrier metal layer 38L may be omitted in some embodiments. In one embodiment, the optional barrier metal layer 38L includes a metallic nitride. For example, the optional barrier metal layer 38L can include titanium nitride.

The gate cavities (25A, 25B) are filled with a metal layer 40L. In an embodiment in which a barrier metal layer 40L is employed, the metal layer 40L can be deposited directly on the optional barrier metal layer 38L. In an embodiment in which a barrier metal layer is not employed, the metal layer 40L can be deposited directly on the exposed surfaces of the lower second planar work function metal layer 36L', the upper second planar work function metal layer 36L", the second planar work function material portion 34A, the planar work function material portion 34B, and the sidewalls of the gate dielectric layer 32L within the first and second gate cavities (25A, 25B).

The metal layer 40L can include a metal deposited by physical vapor deposition or chemical vapor deposition. For example, the metal layer 40L can be an aluminum layer or an aluminum alloy layer deposited by physical vapor deposition. The thickness of the metal layer 40L, as measured in a planar region of the metal layer 40L above the top surface of the planarization dielectric layer 60, can be from 100 nm to 500 nm, although lesser and greater thicknesses can also be employed. In one embodiment, the metal layer 40L consists essentially of a single elemental metal such as Al, Au, Ag, Cu, or W. For example, the metal layer 40L can consist essentially of aluminum.

Figure 14:
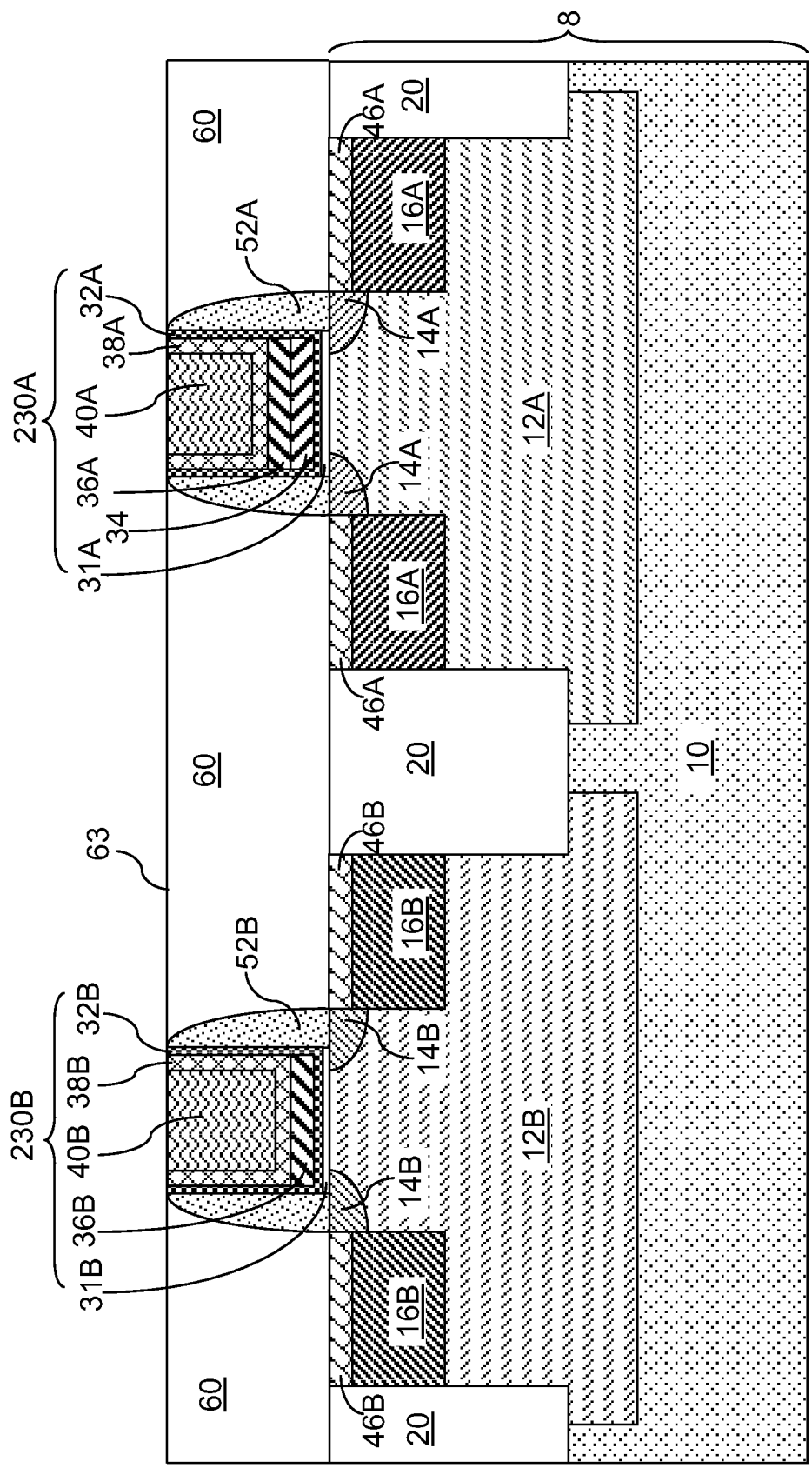
FIG. 14 is a vertical cross-sectional view of the exemplary semiconductor structure after planarization.

Referring to FIG. 14, the metal layer 40L, the optional barrier metal layer 38L, the lower second planar work function metal layer 36L', the upper second planar work function metal layer 36L", and the gate dielectric layer 32L are planarized, for example, by chemical mechanical planarization. Specifically, portions of the metal layer 40L, the optional barrier metal layer 38L, the lower second planar work function metal layer 36L', the upper second planar work function metal layer 36L", and the gate dielectric layer 32L are removed from above the planar dielectric surface 63 of the planarization dielectric layer 60 at the end of the planarization step. The remaining portion of the gate dielectric layer 32L in the first device region forms a first gate dielectric 32A, and the remaining portion of the gate dielectric layer 32L in the second device region forms a second gate dielectric 32B. The remaining portion of the optional barrier metal layer 38L in the first device region forms a first optional barrier metal portion 38A, and the remaining portion of the optional barrier layer in the second device region forms a second optional barrier metal portion 38B. The remaining portion of the metal layer 40L in the first device region constitutes a first metal portion 40A, and the remaining portion of the metal layer 40L in the second deice region constitutes a second metal portion 40B. The topmost surfaces of the first and second gate dielectrics (32A, 32B), the first and second optional barrier metal portions (38A, 38B), and the first and second metal portions (40A, 40B) are coplanar with the topmost surface of the planarization dielectric layer 60.

Thus, replacement gate stacks are formed within the volume previously occupied by the first and second gate cavities (25A, 25B) at the step of FIG. 6. The replacement gate stacks include a first replacement gate stack 230A located in the first device region and a second replacement gate stack 230B located in the second device region. Each replacement gate stack (230A, 230B) overlies a channel region of a field effect transistor. The first replacement gate stack 230A and the second replacement gate stack 230B are formed concurrently.

A first field effect transistor is formed in the first device region. The first field effect transistor includes the second conductivity type well 12A, the first source/drain extension regions 14A, the first embedded stress-generating source/drain regions 16A, the first metal semiconductor alloy portions 46A, the first replacement gate stack 230A, and the first gate spacer 52A. The first replacement gate stack 230A includes the optional first semiconductor-element-containing dielectric layer 31A, the first gate dielectric 32A, the first planar work function material portion 34, the second planar work function material portion 36A, the first optional barrier metal portion 38A, and the first metal portion 40A.

A second field effect transistor is formed in the second device region. The second field effect transistor includes the first conductivity type well 12B, the second source/drain extension regions 14B, the second embedded stress-generating source/drain regions 16B, second metal semiconductor alloy portions 46B, the second replacement gate stack 230B, and the second gate spacer 52B. The second replacement gate stack 230B includes the optional second semiconductor-element-containing dielectric layer 31B, the second gate dielectric 32B, the work function material portion 36B, the second optional barrier metal portion 38B, and the second metal portion 40B. The second planar work function material portion 36A in the first replacement gate stack 230A and the work function material portion 36B in the second replacement gate stack 230B have the same material composition and the same thickness.

Each of the first and second gate dielectrics (32A, 32B) is a U-shaped gate dielectric, which includes a horizontal gate dielectric portion and a vertical gate dielectric portion extending upward from peripheral regions of the horizontal gate dielectric portion. In the first field effect transistor, the first work function material portion 34 and the second work function material portion contact inner sidewalls of the vertical gate dielectric portion of the first gate dielectric 32A. In the second field effect transistor, the work function material portion 36B contacts inner sidewalls of the vertical gate dielectric portion of the second gate dielectric 32B. Each U-shaped gate dielectric is located on the semiconductor substrate 8 and is embedded in the planarization dielectric layer 60. At least one planar work function material portion is located within each U-shaped gate dielectric. The at least one planar work function material portion can be a planar work function material portion 36B located within the second gate dielectric 32B, or can be a vertical stack of the first planar work function material portion 34 and the second planar work function material portion 36A.

Each of the at least one planar work function material portion and has a topmost surface that is recessed from the topmost surface of the planarization dielectric layer 60. The topmost surface of the at least one planar work function material portion can be a horizontal surface that extends from one inner sidewall of a U-shaped gate dielectric to another inner sidewall of the U-shaped gate dielectric. Each of the at least one planar work function material portion, i.e., each of the first planar work function material portion 34, the second planar work function material portion 36A, and the planar work function material portion 36B, can have a uniform thickness between one inner vertical sidewall of a U-shaped gate dielectric and another inner vertical sidewall of the U-shaped gate dielectric.

Each gate dielectric (32A, 32B), as a U-shaped gate dielectric, includes a horizontal gate dielectric portion and a vertical gate dielectric portion. The vertical gate dielectric portion contiguously extends from the horizontal gate dielectric portion to the topmost surface of the planarization dielectric layer 60. If the first and second barrier metal portions (38A, 38B) are present, the entirety of inner sidewalls of each U-shaped gate dielectric (32A, 32B) contacts sidewalls of the at least one planar work function material portion and first and second barrier metal portions (38A, 38B). If first and second barrier metal portions are not present, the entirety of inner sidewalls of each U-shaped gate dielectric (32A, 32B) contacts sidewalls of the at least one planar work function material portion and a metal portion, which is either the first metal portion 40A or the second metal portion 40B. Inner sidewalls of a gate spacer (52A, 52B) contacts outer sidewalls of each gate dielectric.

Each of the at least one planar work function material portion (34, 36A, 36B) can include a metallic material selected from Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, a stack thereof, a conductive oxide thereof, a conductive nitride thereof, an alloy thereof, and a combination thereof. Within the stack of the first planar work function material portion 34 and the second planar work function material portion 36A, the first planar work function material portion 34 includes a first metallic material and the second planar work function material portion 36A includes a second material. In one embodiment, the first material can be selected from Pt, Rh, Ir, Ru, Cu, Os, Be, Co, Pd, Te, Cr, Ni, TiN, a stack thereof, a conductive oxide thereof, a conductive nitride thereof, an alloy thereof, and a combination thereof, and the second metallic material can be selected from Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, a stack thereof, a conductive oxide thereof, a conductive nitride thereof, an alloy thereof, and a combination thereof. In another embodiment, the first material can be selected from Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, a stack thereof, a conductive oxide thereof, a conductive nitride thereof, an alloy thereof, and a combination thereof, and the second metallic material can be selected from Pt, Rh, Ir, Ru, Cu, Os, Be, Co, Pd, Te, Cr, Ni, TiN, a stack thereof, a conductive oxide thereof, a conductive nitride thereof, an alloy thereof, and a combination thereof.

Figure 15:
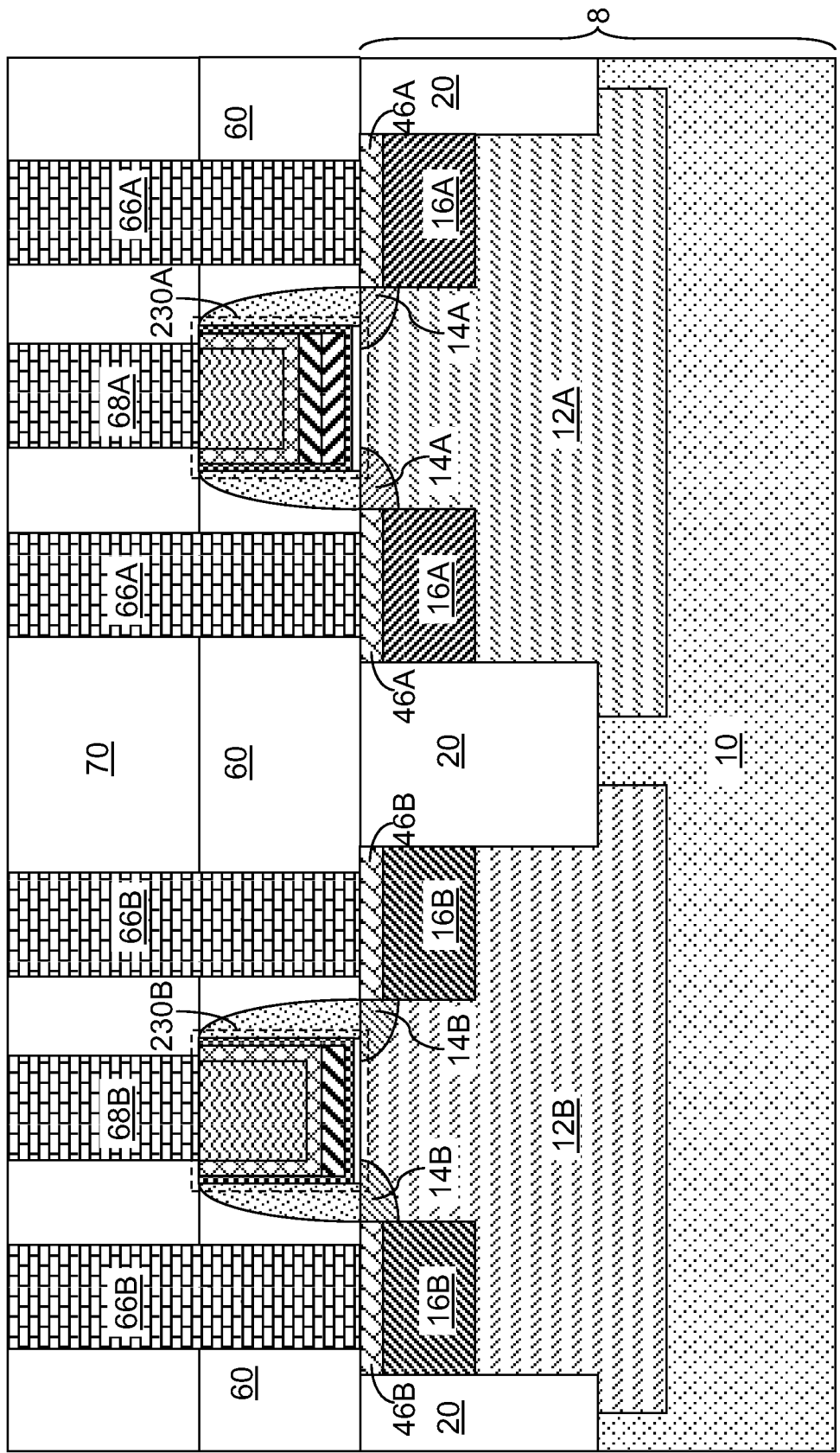
FIG. 15 is a vertical cross-sectional view of the exemplary semiconductor structure after formation of a contact level dielectric layer and contact via structures.

Referring to FIG. 15, a contact level dielectric layer 70 is deposited over the planarization dielectric layer 60. Various contact via structures can be formed, for example, by formation of contact via cavities by a combination of lithographic patterning and an anisotropic etch followed by deposition of a conductive material and planarization that removes an excess portion of the conductive material from above the contact level dielectric layer 70. The various contact via structures can include, for example, first source/drain contact via structures (i.e., at least one first source contact via structure and at least one first drain contact via structure) 66A, second source/drain contact via structures (i.e., at least one second source contact via structure and at least one second drain contact via structure) 66B, a first gate contact via structure 68A, and a second gate contact via structure 68B. Each source contact via structure (66A, 66B) and each drain contact via structure (66A, 66B) are embedded in the planarization dielectric layer 60 and the contact level dielectric material layer 70. Each source contact via structure (one of 66A and 66B) contacts a source-side metal semiconductor alloy portion (one of 46A and 46B), and each drain contact via structure (another of 66A and 66B) contacts a drain-side metal semiconductor alloy portion (another of 46A and 46B).

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
    a planarization dielectric layer having a planar topmost surface and located on a semiconductor substrate;
    a first gate stack comprising:
        a U-shaped gate dielectric located on a bottom and sidewalls of a first gate cavity laterally surrounded by said planarization dielectric layer and located in a first device region of said semiconductor substrate;
        a first planar work function material portion comprising a first metallic material having a first work function and present on a horizontal portion of said U-shaped gate dielectric;
        a second planar work function material portion present on said first planar work function material portion, said second planar work function material portion comprising a second metallic material having a second work function different from said first metallic material and having a topmost surface that is recessed from said planar topmost surface of said planarization dielectric layer; and
        a metal portion present on said topmost surface of said second planar work function material portion, said metal portion having a top surface that is coplanar with said planar topmost surface of said planarization dielectric layer; and
    a second gate stack comprising:
        another U-shaped gate dielectric located on a bottom and sidewalls of a second gate cavity laterally surrounded by said planarization dielectric layer and located in a second device region of said semiconductor substrate;
        another second planar work function material portion present on a horizontal portion of said another U-shaped gate dielectric, said another second planar work function material portion having a topmost surface that is recessed from said planar topmost surface of said planarization dielectric layer, and
        another metal portion present on said topmost surface of said another second planar work function material portion, said another metal portion having a top surface that is coplanar with said planar topmost surface of said planarization dielectric layer.

2. The semiconductor structure of claim 1, wherein each of said first and said second planar work function material portions has a uniform thickness between one inner vertical sidewall of said U-shaped gate dielectric and another inner vertical sidewall of said U-shaped gate dielectric, and wherein said another second planar work function material portion has a uniform thickness between one inner vertical sidewall of said another U-shaped gate dielectric and another inner vertical sidewall of said another U-shaped gate dielectric.

3. The semiconductor structure of claim 1, wherein said first metallic material is selected from Pt, Rh, Ir, Ru, Cu, Os, Be, Co, Pd, Te, Cr, Ni, TiN, a stack thereof, a conductive oxide thereof, a conductive nitride thereof, an alloy thereof, and a combination thereof, and wherein said second metallic material is selected from Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, a stack thereof, a conductive oxide thereof, a conductive nitride thereof, an alloy thereof, and a combination thereof.

4. The semiconductor structure of claim 1, wherein each of said U-shaped gate dielectric and said another U-shaped gate dielectric includes the horizontal portion and a vertical portion that contiguously extends from said horizontal portion to said planar topmost surface of said planarization dielectric layer.

5. The semiconductor structure of claim 1, wherein said topmost surface of said second planar work function material portion is a horizontal surface that extends from one inner sidewall of said U-shaped gate dielectric to another inner sidewall of said U-shaped gate dielectric, and wherein said topmost surface of said another second planar work function material portion is a horizontal surface that extends from one inner sidewall of said another U-shaped gate dielectric to another inner sidewall of said another U-shaped gate dielectric.

6. The semiconductor structure of claim 1, wherein an entirety of inner sidewalls of said U-shaped gate dielectric contacts sidewalls of said first and said second planar work function material portions and said metal portion, and wherein an entirety of inner sidewalls of said another U-shaped gate dielectric contacts sidewalls of said another second planar work function material portion and said another metal portion.

7. The semiconductor structure of claim 1 further comprising a gate spacer having inner sidewalls that contact outer sidewalls of said U-shaped gate dielectric, and another gate spacer having inner sidewalls that contact outer sidewalls of said another U-shaped gate dielectric.

8. The semiconductor structure of claim 1, wherein sidewalls of said first planar work function material portion and sidewalls of said second planar work function material portion contact a vertical portion of said U-shaped gate dielectric, and wherein sidewalls of said another second planar work function material portion contact a vertical portion of said another U-shaped gate dielectric.

9. The semiconductor structure of claim 1, further comprising:
an embedded stress-generating source region and an embedded stress-generating drain region that are epitaxially aligned to a single crystalline semiconductor material of a body of a field effect transistor in said first device region or a body of another field effect transistor in said second device region.

10. The semiconductor structure of claim 9, further comprising;
a source-side metal semiconductor alloy portion and a drain-side metal semiconductor alloy portion located on said embedded stress-generating source region and said embedded stress-generating drain region, respectively.

11. The semiconductor structure of claim 10, further comprising:
a contact level dielectric material layer located above said planarization dielectric layer.

12. The semiconductor structure of claim 11, further comprising
a source contact via structure and a drain contact via structure embedded in said planarization dielectric layer and said contact level dielectric material layer and contacting said source-side metal semiconductor alloy portion and said drain-side metal semiconductor alloy portion, respectively.

13. The semiconductor structure of claim 1, wherein said semiconductor substrate is a semiconductor-on-insulator substrate.

14. The semiconductor structure of claim 1, wherein said U-shaped gate dielectric and said another U-shaped gate dielectric comprise a dielectric material having a dielectric constant of greater than 8.0.

15. The semiconductor structure of claim 14, wherein said dielectric material having said dielectric constant of greater than 8.0 is selected from the group consisting of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from 0.5 to 3 and each value of y is independently from 0 to 2.

16. The semiconductor structure of claim 1, wherein said metal portion and said another metal portion include a metal selected from the group consisting of Al, Au, Ag, Cu and W.

17. The semiconductor structure of claim 1, wherein said first metallic material is selected from Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, a stack thereof, a conductive oxide thereof, a conductive nitride thereof, an alloy thereof, and a combination thereof, and wherein said second metallic material is selected from Pt, Rh, Ir, Ru, Cu, Os, Be, Co, Pd, Te, Cr, Ni, TiN, a stack thereof, a conductive oxide thereof, a conductive nitride thereof, an alloy thereof, and a combination thereof.

* * * * *